United States Patent [19]
Kamiya

[11] Patent Number: 5,430,389
[45] Date of Patent: Jul. 4, 1995

[54] OUTPUT CIRCUIT WITH A CURRENT INJECTION CIRCUIT INCLUDING A REFERENCE VOLTAGE GENERATOR

[75] Inventor: Yukiya Kamiya, Takasaki, Japan

[73] Assignee: Hitachi, Ltd., Tokyo, Japan

[21] Appl. No.: 127,611

[22] Filed: Sep. 28, 1993

[30] Foreign Application Priority Data

Sep. 29, 1992 [JP] Japan .................. 4-259339

[51] Int. Cl.⁶ ............................................. H03K 17/16
[52] U.S. Cl. ........................................ 326/27; 326/87; 326/17
[58] Field of Search .............. 307/443, 451, 475, 263, 307/548, 550

[56] References Cited

U.S. PATENT DOCUMENTS

| | | | |
|---|---|---|---|
| 5,153,450 | 10/1992 | Ruetz | 307/443 |
| 5,166,555 | 11/1992 | Kano | 307/443 X |
| 5,296,757 | 3/1994 | Koizumi | 307/443 |
| 5,329,175 | 7/1994 | Peterson | 307/263 X |
| 5,332,932 | 7/1994 | Runaldue | 307/443 |
| 5,334,889 | 8/1994 | Hisaka | 307/443 X |

FOREIGN PATENT DOCUMENTS

| | | |
|---|---|---|
| 61108223 | 5/1986 | Japan . |
| 289419 | 3/1990 | Japan . |
| 2250425 | 10/1990 | Japan . |
| 2301098 | 12/1990 | Japan . |
| 341818 | 2/1991 | Japan . |

Primary Examiner—David R. Hudspeth
Attorney, Agent, or Firm—Antonelli, Terry, Stout & Kraus

[57] ABSTRACT

An output circuit and a bus buffer semiconductor LSI circuit which have functions of high speed and low power consumption while suppressing generation of undershoot and ringing in an output signal. The output circuit includes a delay circut and a current injecting circuit. The current injecting circuit operates so that, when a voltage at an output terminal of the output circuit is changed from a first level to a second level lower than the first level, it supplies a current to an output terminal only for a period of time after the voltage of the output terminal reaches a predetermined level. As a result, the load driving capability of the output circuit can be made effectively small only for a period of time during which the current injection circuit supplies the current to the output terminal.

6 Claims, 13 Drawing Sheets

5,430,389

OUTPUT CIRCUIT WITH A CURRENT INJECTION CIRCUIT INCLUDING A REFERENCE VOLTAGE GENERATOR

BACKGROUND OF THE INVENTION

The present invention relates to a semiconductor output circuit and a bus buffer semiconductor integrated circuit, and more particularly, to a bus buffer semiconductor integrated circuit which reduces the power consumption and noise of an output circuit caused by a capacitive load.

For example, a capacitive load is connected via an external wiring line to an output terminal of an output circuit formed as a semiconductor integrated circuit. When the level of a signal at the output terminal of the output circuit is inverted, the output circuit operates to charge or discharge the capacitive load. Thus, when the external wiring line is long, the capacitive load is considered to be large, which demands the output circuit to have a high load driving capability. This is because, in the case where the load driving capability is low in spite of the fact that the capacitive load is large, much time is required to invert the signal level of the output terminal, which results in the operation of the output circuit becomes dull or slow. However, it is further considered that a parasitic inductance caused by the external wiring line is equivalently connected between the output terminal and capacitive load. For this reason, in the event where the output circuit has a high load driving capability, when the signal level of the output terminal is inverted, there may occur such a situation that undershoot, overshoot and/or ringing takes place in the signal of the output terminal under the influences of the parasitic inductance. Undershoot is such a phenomenon that when the potential at the output terminal varies from the high level to the low level, the potential at the output terminal is reduced to a level lower than the low level. Overshoot is such a phenomenon that when the potential at the output terminal varies from the low level to the high level, the potential at the output terminal is increased to a level higher than the high level. Further, ringing is such a phenomenon that after generation of undershoot or overshoot, the voltage at the output terminal vibrates.

When the undershoot, overshoot and/or ringing occurs, this may cause a circuit connected to the output terminal to be erroneously operated. Further, when ringing takes place, this causes variations of a power voltage, which may cause erroneous operation of a circuit within the same chip for receiving the power voltage. Furthermore, when ringing takes place, an electromagnetic resonance phenomenon (EMI) causes noise to generate in the peripheral space of the output circuit.

There has been suggested a prior art output circuit that can suppress generation of undershoot, overshoot and/or ringing while retaining a high load driving capability.

Disclosed in JP-A-2-250425 and JP-A-2-301098 are output circuits which includes a plurality of n-channel MOS transistors connected in parallel to an output terminal and a plurality of p-channel MOS transistors connected in parallel to the output terminal so that, when an output voltage falls, the number of the n-channel MOS transistors to be turned ON is increased in a step-like manner, while, when the output voltage rises, the number of the p-channel MOS transistors to be turned on is increased in a step-like manner.

Also disclosed in JP-A-3-41818 is an output circuit which includes a plurality of n-channel MOS transistors connected in parallel to an output terminal and a plurality of p-channel MOS transistors connected in parallel to the output terminal so that, when an output voltage falls, the number of the n-channel MOS transistors to be turned ON is decreased in a step-like manner, while, when the output voltage rises, the number of the p-channel MOS transistors to be turned ON is decreased in a step-like manner.

JP-A-61-108223 discloses an output circuit which includes an n-channel MOS transistor is designed so that, when an output voltage falls, the gate and drain of the transistor are connected to an output terminal at the initial stage of the falling of the output voltage in a diode connection between the output terminal and a grounding terminal, and then the gate is cut off from the output terminal to provide a predetermined voltage.

There is disclosed in JP-A-2-89419 an output circuit wherein, in a period from a change of an output signal from its high level to low level to a change of the output signal again to the high level, an n-channel MOS transistor is provided for injecting a current to an output terminal continuously for a period after the output signal falls to a predetermined voltage until the output signal rises again to the predetermined voltage.

Also disclosed in JP-A-2-89419 an output circuit which includes an n-channel MOS transistor for injecting a current to an output terminal, and wherein, in a period from a change of an output signal from its high level to low level to a change of the output signal again to the high level, the n-channel MOS transistor operates to inject the current to the output terminal continuously for a period after the output signal falls to a predetermined voltage until the output signal rises again to the predetermined voltage. Accordingly, it has been clarified by the inventor of the present application that even after the voltage at the output terminal is reduced to the low level to suppress the generation of undershoot, the above n-channel MOS transistor continues to inject the current to the output terminal until the voltage of the output terminal rises again to the above predetermined level, which results in that useless power not contributing to the undershoot suppression is inevitably consumed. It has also been found by the inventor that since such a circuit is provided as to supply a predetermined voltage to the gate of the n-channel MOS transistor constantly regardless of the voltage levels of the input and output signals, the power consumption of the output circuit is disadvantageously made much large.

SUMMARY OF THE INVENTION

It is an object of the present invention to provide an output circuit and a bus buffer semiconductor integrated circuit which can suppress generation of undershoot and ringing together with features of fast operation and low power consumption.

Typical one of features of the present invention disclosed in the present application will be briefly explained as follows.

In accordance with an aspect of the present invention, there is provided an output circuit which includes input and output terminals and an output stage for charging and discharging a capacitive load connected to the output terminal, and wherein there is provided a current injection means for injecting a current to the output terminal only for a predetermined period of time when a change of a voltage at the input terminal from a first level to a second level causes a change of a voltage at the output terminal from a third level to a fourth level. The current injection means starts to send the current to the output terminal when the voltage of the output terminal reaches a fifth level between the third and fourth levels, and stops the current injection to the output terminal when a predetermined time elapses after the voltage of the output terminal reaches a sixth level between the third and fourth levels.

With the above arrangement, when the input signal varies from the first level to the second level and the output signal varies from the third level to the fourth level, the load driving capability of the output circuit is made high before the current injection means injects the current to the output terminal, so that the capacitive load connected to the output terminal is charged at a high rate, while, the load driving capability is made low after the current injection means injects the current to the output terminal to thereby suppress the generation of undershoot. For this reason, the high speed operation of the output circuit and the suppression of generation of undershoot and ringing in the output signal can be realized at the same time. Further, the current injection to the output terminal by the current injection means is started when the voltage of the output terminal reaches a predetermined level. Therefore, there can be eliminated a problem in such an undershoot prevention output circuit that is designed to determine the start timing of the current injection on the basis of a change in the input signal, that is, such a problem that the effect of the undershoot suppression is determined by the magnitude of the capacitive load connected to the output terminal. A time necessary for the capacitive load to be discharged when the capacitive load connected to the output terminal is large becomes larger than that when the connected capacitive load is small. Even in such a case, in accordance with the output circuit of the present invention, the voltage at the output terminal can be made to fall at a high rate while suppressing the undershoot. Further, when a predetermined time elapses after the voltage of the output terminal reaches the sixth level between the third and fourth levels, the current injection means can stop the current injection to the output terminal. Thus, when compared with the case where the stop timing of the current injection to the output terminal is determined by the voltage of the input terminal, the output circuit of the present invention can be made small in power consumption.

The above object and other objects as well as novel features of the present invention will become apparent from the following description, with reference to the accompanying drawings.

DESCRIPTION OF THE PREFERRED EMBODIMENTS

Embodiments of the present invention will be detailed with reference to the accompanying drawings.

Figure 1:
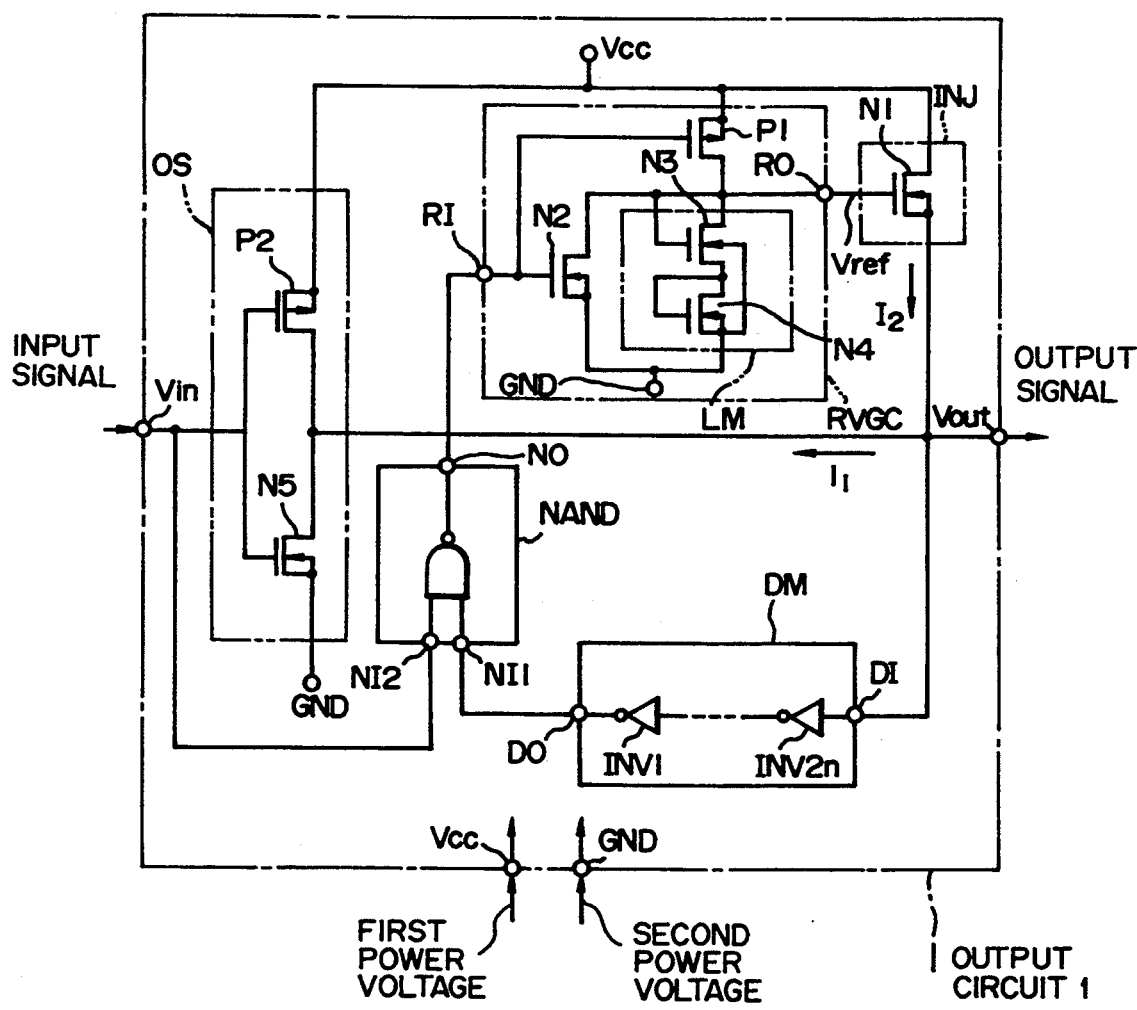
FIG. 1 is a configuration of an output circuit in accordance with an embodiment of the present invention.

Referring first to FIG. 1, there is shown an output circuit in accordance with an embodiment of the present invention, in which constituent elements featuring the present invention are conceptionally given for easy understanding of the present invention. An output circuit 1 of the present invention, which is encircled by a chain-dotted line, is formed, for example, on such a semiconductor substrate as a single crystalline (monolithic) silicon substrate by a well known semi-conductor integrated circuit fabricating technique, though the present invention is not intended to be restricted to this specific example. The output circuit 1 has an input terminal Vin for receiving an input signal from outside of the output circuit, a first power supply terminal Vcc to which a first power voltage is supplied from outside of the output circuit, a second power supply terminal GND to which a second power voltage is supplied from outside of the output circuit, and an output terminal Vout from which an output signal of the output circuit 1 is supplied to outside of the output circuit. The first power supply terminal Vcc is contacted, for example, through a through hole or the like made through wiring layers with a power supply wiring line formed as an aluminum wiring line on predetermined one of a plurality of wiring layers (not shown) three-dimensionally formed on a semiconductor substrate. Further, the second power supply terminal GND is contacted through a through hole or the like with a grounding wiring line formed as an aluminum wiring line on a predetermined wiring layer (not shown). When the output circuit is operated on TTL or CMOS level basis, the first power voltage is set, e.g., at 5 V and the second power voltage is at a grounding level of 0 V, though the first and second power voltages are not specifically restricted to these examples. The output circuit 1 includes an output stage OS, a current injection circuit INJ for injecting a current into the output terminal Vout for prevention of undershoot, a reference voltage generation circuit RVGC, a NAND circuit NAND and a delay circuit DM. For brevity of explanation, the current injection circuit INJ, reference voltage generation circuit RGVC, NAND circuit NAND and delay circuit DM are collectively referred to merely as a current injection means; while the reference voltage generation circuit RVGC, NAND circuit NAND and delay circuit DM of the current injection means are collectively referred to merely as a gate voltage setting means. Although a plurality of the terminals Vcc and GND are given in the interior of the output circuit of FIG. 1 encircled by the chain-dotted line, it will be appreciated that these terminals Vcc and GND are connected to power supply and grounding wiring lines outside the output circuit via the first power supply terminal Vcc and the second power supply terminal GND of the output circuit 1 provided on the chain-dotted line.

The current injection circuit INJ is made up of an N-channel MOS transistor N1 (which will be referred to merely as the transistor N1, hereinafter) having a drain connected to the first power supply terminal Vcc and a source connected to the output terminal Vout. Supplied to the gate of the transistor N1 is a predetermined level of reference voltage Vref (which will be described later) for a predetermined period of time by means of the current injection means.

Detailed explanation will next be made as to the respective reference voltage generation circuit RVGC and NAND circuit NAND of the gate voltage setting means, as to the respective elements of the delay circuit DM as well as the respective elements of the output stage OS.

The reference voltage generation means RVGC includes an output terminal RO connected to the gate of the transistor N1, an input terminal RI connected to an output terminal NO of the NAND circuit, a p-channel transistor P1 having a source connected to the first power supply terminal Vcc and a drain connected to the output terminal RO and a gate connected to the input terminal RI, a load means LM connected between the output terminal RO and the second power supply terminal GND, and an n-channel MOS transistor N2 having a drain connected to the output terminal RO and a source connected to the second power supply terminal GND and a gate connected to the input terminal RI. The load means LM further has an n-channel MOS transistor N3 having a gate and a drain connected to the output terminal RO, and an n-channel MOS transistor N4 having a gate and a drain connected to the source of the transistor N3 and a source connected to the second power supply terminal GND. In other words, the transistors N3 and N4 are diode connected between the output terminal RO and the second power supply terminal GND in series.

The delay circuit DM includes an input terminal DI connected to the output terminal Vout, an output terminal DO connected to a first input terminal NI1 of the NAND circuit, and a plural even number of inverter circuits INV1 to INV2n (n: natural number) connected between the input terminal DI and the output terminal Vout in series.

The NAND circuit NAND includes the first input terminal NI1 connected to the output terminal DO of the delay circuit DO, a second input terminal NI2 connected to the input terminal Vin, and the output terminal NO connected to the input terminal RI of the reference voltage generation means RVGC. The NAND circuit NAND functions to perform a logical 'NAND' operation on signals received from the first and second input terminals NI1 and NI2 and to output its logical NAND output to the output terminal NO.

The output stage OS includes a p-channel MOS transistor P2 and an n-channel MOS transistor N5 which are connected between the first and second power supply terminals Vcc and GND in series. The source of the transistor P2 is connected to the first power supply terminal Vcc to be supplied with a first power voltage of 5 V, while the drain of the transistor P2 is connected to the drain of the transistor N5 and also to the output terminal Vout. Further, the drain of the transistor N5 is connected to the drain of the transistor P2 and also to the output terminal Vout; while the source of the transistor N5 is connected to the second power supply terminal GND to be supplied with a second power voltage of 0 V. The common gates of the transistors P5 and N2 are connected to the input terminal Vin to receive an input signal of the output circuit. For this reason, the output stage OS responds to the input signal and outputs an output signal of 5 V or 0 V to the output terminal Vout.

The substrate of the transistors N2 to N5 is connected to the second power supply terminal GND, while the substrate of the transistors P1 and P2 is connected to the first power supply terminal Vcc. Meanwhile, the substrate of the transistor N1 is connected not to the second power supply terminal GND but to its own source. Since the substrate of the transistor N1 is connected to its source in this way, the resultant substrate effect can eliminate variations in the threshold value. All the threshold voltages for such transistors as shown in FIG. 1 are set all at an identical value Vth(V), though the present invention is not especially restricted to the specific value.

Figure 2:
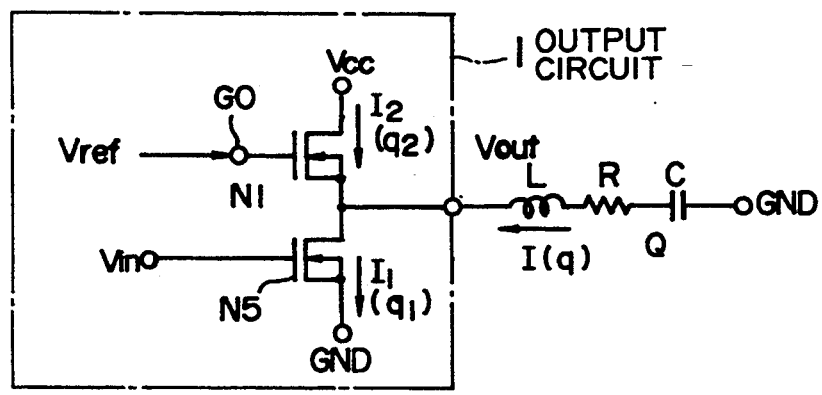
FIG. 2 is a diagram for explaining how to suppress undershoot.

Explanation will next be made as to the case where, when the value of the input signal varies, at what timing a current starts to be injected into the output terminal or to be stopped through the transistor N1, by referring to FIGS. 2 and 3.

The basic concept of how to suppress generation of undershoot will be explained by referring to FIG. 2. Among the elements of the output circuit 1 of FIG. 1, the transistors N1 and N5 are shown in FIG. 2, together with a parasitic inductance L, a parasitic resistance R and a capacitive load C which are inherently caused by the wiring or the like of outside of the output circuit. The other constituent elements of the output circuit 1 which do not contribute directly to the generation of the undershoot, are omitted. At a time 't', a charge quantity charged in the capacitive load C is Q Coulombs (C). In other words, a charge quantity supplied from the capacitive load C to the output terminal Vout for a very small period of time starting from a given time 't' is 'q' (C), or a current supplied from the capacitive load C to the output terminal Vout at a given time 't' is I(A)o A charge quantity supplied to the output terminal Vout through the transistor N1 for a very small period of time starting from a given time 't' is 'q2' C, while a current supplied to the output terminal Vout through the transistor N1 at a given time 't' is I2(A). Further, a charge quantity drawn from the output terminal Vout by the transistor N5 for a very small period of time starting from a given time 't' is 'q1' (C), while a current drawn from the output terminal Vout by the transistor N5 at a given time 't' is Ii(A). In this conjunction, there are relationships I=dq/dt, I1=dq1/dt and I2=dq2/dt between the above charge quantities and currents. Accordingly, at a time 't' at which the transistor N1 is in its OFF state and the capacitive load accumulates a charge of Q (C); q=q1 and I=I1 (q2=2 and I2=0). At a time 't' at which the transistors N5 and N1 are both in their ON state and the capacitive load accumulates a charge of Q (C); q=q1−q2 and I=I1−I2 (q2>0 and I2>0). For this reason, the current I flowing at a time 't' and the charge quantity flowing for a very small period of time starting from the time 't' when the transistors N1 and N5 are both in the ON state, are smaller by amounts of I2 and q2 than those when the transistor N5 is in the ON state and the transistor N1 is in the OFF state, respectively. Undershoot takes place when the current I drawn from the capacitive load C increases with time. When the transistor N1 changes from its OFF state to the ON state, the current I drawn from the capacitive load C is decreased, so that the absolute value of a variation in the voltage of the output terminal Vout per time becomes small, which causes no generation of such undershoot. However, after the transistor N1 is changed to its ON state, the current I drawn from the capacitive load C is decreased so that a discharging time of the capacitive load C becomes long. When timing of current injection into the output terminal Vout is fast, generation of undershoot can be effectively prevented but a time necessary for the output voltage to fully fall down to its low level becomes large. When timing of current injection into the output terminal Vout is slow, on the other hand, undesirable undershoot cannot be suppressed in some cases. From the above consideration, it will be appreciated that, when the current injection timing is made as slow as possible in such a range that it causes no generation of the undershoot, an improvement in the falling rate can be expected. As explained above, when it is desired to discharge the capacitive load C, injection of a current into the output terminal Vout enables the prevention of generation of undesirable undershoot after the current injection.

Figure 3:
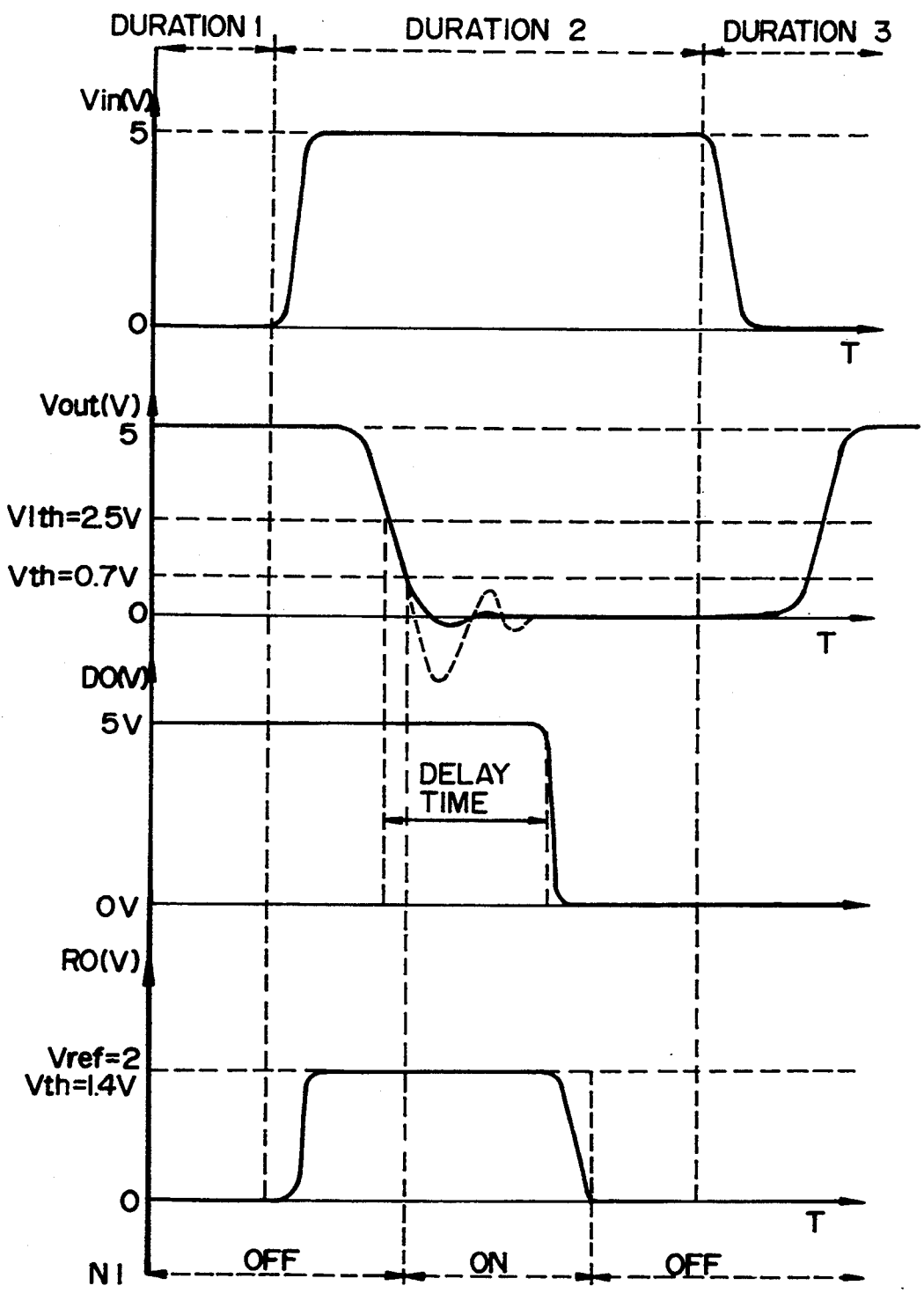
FIG. 3 is a timing chart for explaining the operation of the output circuit of FIG. 1.

FIG. 3 shows a voltage (which will be referred to as the output voltage, hereinafter) at the output terminal Vout, a gate voltage vref of the transistor N1, a voltage of the output terminal DO of the delay means DM, and the ON/OFF states of the transistor N1, when a voltage (which will be referred to as the input voltage, hereinafter) at the input terminal Vin varies from its low level of 0 to a high level of 5 V and again from the high level of 5 V to the low level of 0 V. Although the input voltage actually repetitively varies from the high level 5 V to the low level 0 V or vice versa, only a period of the input voltage during which the input voltage is changed from the low level 0 V to the high level 5 V and again from the high level 5 V to the low level 0 V, are shown in FIG. 3. In FIG. 3, the full period of the input voltage varied from the low level 0 V to the high level 5 V and again from the high level 5 V to the low level 0 V are illustrated as divided into durations 1, 2 and 3, which will be explained below. In the duration 1, the voltage on the input terminal Vin is of the low level 0 V. In the duration 2, the input voltage starts to change from the low level 0 V to the high level 5 V, maintains the high level and then ends in changing to the low level. In the duration 3, the input voltage starts to change from the high level 5 V to the low level 0 V and then maintains the low level, which is followed again by the duration 1.

In the duration 1, since the input voltage is at the low level 0 V, the output stage OS provides the high level 5 V to the output terminal Vout. More specifically, a voltage at the output terminal DO of the delay means DM for the transistor N1 is 5 V. Since the NAND circuit NAND receives the voltage 5 V as logic '1' at its first input terminal NI1 and the voltage 0 V as logic '0' at its second input terminal NI2, the NAND circuit NAND outputs a voltage of the high level 5 V as logic '1' to the output terminal NO. This causes the transistor N2 of the reference voltage generation means RVGC to be turned ON, so that the transistors P1, N3 and N4 are turned OFF. As a result, the transistor N2 provides an output voltage of 0 V to the output terminal RO. In other words, the gate voltage Vref of the transistor N1 is set at 0 V.

In the next duration 2, the input voltage is varied from 0 V to 5 V. This causes the output voltage to start to gradually decrease from 5 V toward 0 V through the output stage OS. The gate voltage Vref of the transistor N1, in response to a variation of the input voltage to 5 V, is set at twice a threshold voltage Vth of the transistor N1, though the present invention is not specifically limited to the specific example. This is because, when the input voltage is 5 V, a voltage of 5 V as logic "1" is applied to both the first and second input terminals of the NAND circuit NAND, so that the NAND circuit provides a low level voltage of 0 V as logic "0" to the output terminal NO. This causes the transistor N2 of the reference voltage generation means RVGC to be turned OFF and the transistors P1, N3 and N4 thereof to be turned ON. As a result, applied to the output terminal RO is a predetermined voltage which is determined by the ON resistance of the transistors P1, N3 and N4. This voltage corresponds to twice the threshold voltage Vth of the transistor N1 as mentioned above. In other words, the gate voltage Vref of the transistor N1 is 2*Vth (V). Supplied to the gate of the transistor N1 is the gate voltage of 2*Vth (V) before the output voltage becomes the threshold voltage Vth of the transistor N1. When the voltage is supplied to the gate of the transistor N1 at such timing as mentioned above, the state of the transistor N1 can be determined only by the level of the output voltage. For this reason, a current can be injected into the output terminal Vout positively at stable timing. The transistor N1 is turned ON when the output voltage reaches the voltage level Vth (V) that corresponds to (the gate voltage 2*Vth (V) of the transistor N1 minus the threshold voltage Vth (V)). The transistor N1 is turned ON when supplied with the gate voltage 2*Vth (V) and when the output voltage is less than Vth (V), so that a current is injected into the output terminal Vout. A voltage at the output terminal DO of the delay means DM is changed from the high level of 5 V to the low level of 0 V, after passage of a predetermined delay time from the decrease of the output voltage to a level smaller than the threshold voltage V1th of the inverter circuit INV2n of the delay means DM. When the voltage at the output terminal DO is changed to 0 V, the output terminal NO of the NAND circuit NAND has the voltage 5 V as logic "1" regardless of the input voltage. Thus, the transistor N2 of the reference voltage generation means RVGC is turned ON and the transistors P1, N3 and N4 thereof are turned OFF. As a result, the transistor N2 outputs the voltage 0 V to the output terminal RO. In other words, the gate voltage Vref of the transistor N1 is set at 0 V. That is, in response to a change of the voltage of the output terminal DO to 0 V, the gate voltage Vref of the transistor N1 is set at 0 V. Further, when the gate voltage Vref is set at 0 V, this causes the transistor N1 to be turned OFF, so that the change of the voltage of the output terminal DO of the delay means DM to 0 V causes the transistor N1 to be turned OFF. In response to the change of the output voltage to the threshold voltage of the transistor N1, the transistor N1 is turned ON; while, in response to the change of the voltage of the output terminal DO of the delay means DM to 0 V, the transistor N1 is turned OFF. Such a duration that the transistor N1 is in the ON state, can be variably controlled by changing the delay time determined by the delay means DM. The delay time is set taking into consideration the power consumption, operating speed, the size of the capacitive load coupled to the output terminal Vout, etc. When the delay time is set to be smaller than an optimum value determined by taking the above conditions into consideration, it might be impossible to sufficiently suppress undershoot. Meanwhile, when the delay time is set to be larger than the above optimum value, current injection to the output terminal is carried out even after the undershoot suppression, which results in large power consumption. Setting of the delay time can be controlled by adjusting the number of stages in the inverter circuits INV2n of the delay means DM. The delay time corresponds to a product of the delay time per the inverter circuit and the number of stages in the inverter circuits. Control of the delay time can be carried out by adjusting the number of stages in the inverter circuits INV2n of the delay means DM or by changing the delay time of per the inverter circuit. For example, when the inverter circuit is made up of a CMOS circuit, the delay time per the inverter circuit can be varied by changing the gate length or gate width. Alternatively, the delay may be achieved by controlling other resistances or capacitances. The substrate of the transistor N1 for the current injection, which is connected to its source, is set always at the same potential as the source. With such an arrangement, the influence of the substrate effect can be eliminated. Thus, since the threshold value can be made smaller than that when the substrate of the transistor N1 is fixed at the grounding level 0 V, the ON state can be achieved with the lower gate voltage. Accordingly, the current injection to the output terminal Vout can be carried out faster.

Next, in the duration 3, the input voltage varies from 5 V to 0 V. This causes the output voltage to be gradually increased from 0 V toward 5 V and eventually kept at 5 V through the output stage OS. When the input voltage starts to change to 0 V, the gate voltage of the transistor N1 is already set at 0 V, so that the transistor N1 is in the OFF state and thus the current injection by the transistor N1 is not already carried out. Thus, in the duration 3, only the state of the output stage OS varies. The state of the output circuit when the output voltage was changed to 5 V in the duration 3, is the same as that in the duration 1. Accordingly, when the input voltage starts to change again toward 5 V after the duration 3, the output circuit varies in the same manner as in the above duration 2 and returns to the duration 3 (duration 1). As has been explained in the foregoing, in accordance with the output circuit of the present invention, the transistor of the output circuit for the current injection, when the input voltage is changed from the high level 5 V to the low level 0 V, injects a current into the output terminal only for a preset period of time after the output signal reaches its predetermined voltage until the undershoot generation is suppressed. The injection period is predetermined according to the load capacitance. For this reason, the undershoot can be positively suppressed and the waste of the power consumption caused by the current continuously flowing through the output terminal even after the suppression of the undershoot generation can be suppressed.

Although the delay means DM has been comprised of the inverter circuits in the present embodiment, the present invention is not restricted to the specific example and may be modified in various ways, so long as a signal having the same phase as a signal applied to the input terminal DI is outputted to the output terminal DO after passage of a predetermined delay time from the application of the signal to the input terminal DI. For example, such an arrangement may be employed that includes a bipolar transistor, a CMOS transistor, a resistor, a capacitor, a combination thereof connected in series or in parallel. Further, the output stage OS has comprised a set of CMOS inverter circuits, i.e., the p-channel and n-channel MOS transistors, but the present invention is not restricted to the specific example. For example, such an arrangement may be employed that a plurality of sets of CMOS inverter circuits are connected in series or the inverter circuits may include bipolar transistors. Though the voltage supplied to the gate of the transistor N1 has been set to be twice the threshold voltage Vth (V) of the transistor N1, the present invention is not restricted to the specific example and the voltage may be set to be more than twice the threshold voltage Vth (V). However, when the voltage supplied to the gate of the transistor N1 is set to be excessively large, the timing of the current injection by the transistor N1 becomes too fast, which results in that the load driving capability of the output circuit becomes too small at the initial stage of the falling output voltage. For this reason, the undershoot generation can be sufficiently suppressed but the time necessary for the output voltage to arrive at 0 V becomes too large. When the voltage supplied to the gate of the transistor N1 is set too small, on the other hand, the current injection timing of the transistor N1 becomes too late, which results in that, in some cases, the current injection of the transistor N1 causes insufficient suppression of the undershoot. Taking these respects into account, the gate voltage of the transistor N1 should be set. Further, in place of the NAND circuit NAND, another logical circuit or a combination of logical circuits capable of performing logical operation equivalent to the circuit NAND may be employed.

Figure 4:
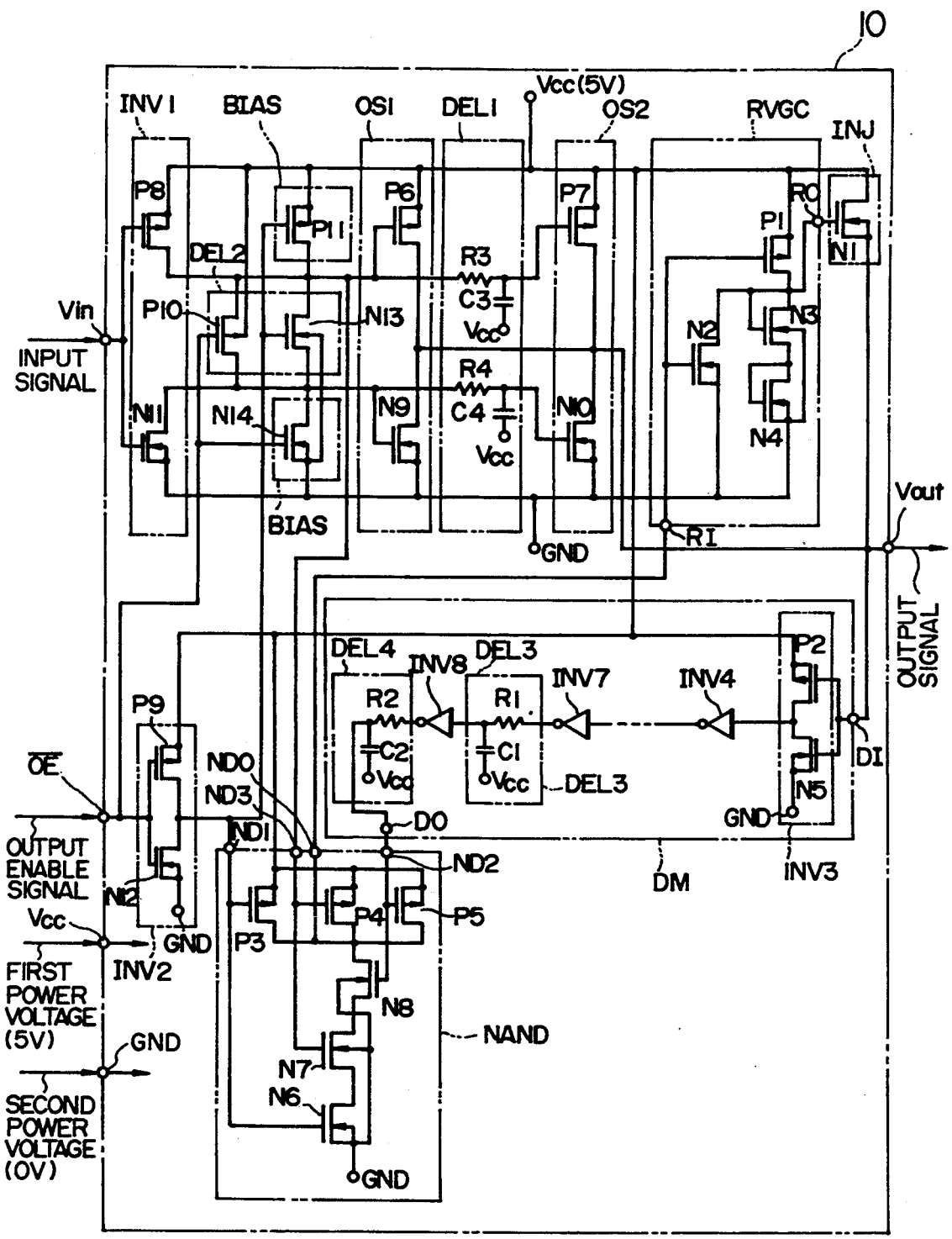
FIG. 4 is a detailed configuration of an output circuit in accordance with another embodiment of the present invention.

Shown in FIG. 4 is a detailed arrangement of an output circuit in accordance with another embodiment of the present invention. The output circuit of FIG. 4 is different from that of FIG. 1 in that, in FIG. 4, an output enable terminal $\overline{OE}$ is newly provided and the output terminal Vout is changed to have a high impedance in response to the level of the output enable signal applied to the output enable terminal $\overline{OE}$.

The arrangement of FIG. 4 will next be detailed. In FIG. 4, a part encircled by a chain-dotted line corresponds to an output circuit 10 which is formed on a semiconductor substrate though not specifically limited to the specific example. The output circuit 10 includes the aforementioned output enable terminal $\overline{OE}$ to which an output enable signal is applied from outside of the output circuit, an input terminal Vin to which an input signal is applied from outside of the output circuit, an output terminal Vout from which an output signal is outputted to outside of the output circuit, a first power supply terminal Vcc to which a first power voltage is supplied from outside of the output circuit, and a second power supply terminal GND to which a second power voltage GND is supplied from outside of the output circuit. When the output enable signal is at a high level of 5 V, the output terminal Vout has a high impedance; while when the output enable signal is at a low level of 0 V, a predetermined level of output signal according to the input signal is outputted from the output terminal Vout. That is, the output circuit 10 shown in FIG. 4 has a so-called three-state output buffer function.

Though not specifically restricted, the output circuit of the present embodiment is operated on the TTL or CMOS level, so that the aforementioned first power voltage is set, for example, at 5 V and the aforementioned first power voltage is set, for example, at 0 V. In this connection, the high and low levels of the signal are 5 V and 0 V respectively.

The output circuit 10 includes a current injection means INJ, a constant-voltage generation means RVGC, a delay means DM, an NAND circuit NAND, a first output stage OS1, a second output stage OS2, a first delay circuit DEL1, a first inverter circuit INV1, a second inverter circuit INV2, a second delay circuit DEL2, and a bias circuit BIAS for setting of high output impedance (which bias circuit will be referred to merely as the bias circuit, hereinafter). The current injection means INJ, constant-voltage generation means RVGC, delay means DM and NAND circuit NAND correspond to the constituent elements having the same reference symbols in FIG. 1 respectively; while the first and second output stages OS1 and OS2 correspond to the output stage OS in FIG. 1.

The current injection means INJ is made up of an n-channel MOS transistor N1 (which will be referred to as the transistor N1, hereinafter) having a drain connected to the first power terminal Vcc and a source and a gate both connected to the output terminal Vout.

The above reference voltage generation means RVGC has an output terminal RO connected to the gate of the transistor N1 and an input terminal RI connected to an output terminal NO of the NAND circuit NAND. The above reference voltage generation means RVGC is also made up of n-channel MOS transistors N2 to N4 and a p-channel MOS transistor P1. More specifically, the n-channel MOS transistor N2 has a gate connected to the input terminal RI, a source connected to the second power supply terminal GND and a drain connected to the output terminal RO. The n-channel MOS transistor N3 has a gate and a drain both connected to the output terminal RO and a source. The transistor N4 has a gate and a drain both connected to the source of the transistor N3 and a source connected to the second power supply terminal GND. The transistor P1 has a gate connected to the input terminal RI, a source connected to the first power supply terminal Vcc and a drain connected to the output terminal RO. With such an arrangement as mentioned above, the reference voltage generation means RVGC responds to a voltage appearing at the input terminal RI and outputs a reference voltage of 0 V or a predetermined potential to the output terminal RO, or in other words, to the gate of the transistor N1.

The aforementioned delay means DM has an input terminal DI connected to the output terminal Vout and an output terminal DO connected to the second input terminal NI2 of the NAND circuit NAND. The delay means DM is also made up of third to eighth inverter circuits INV3 to INV8 and delay circuits DEL3 and DEL4 connected between the input terminal DI and output terminal DO in series. The delay circuit DEL3 has a resistor R1 and a capacitor C1 connected between one end of the resistor R1 and the first power supply terminal Vcc. Similarly, the delay circuit DEL4 has a resistor R2 and a capacitor C2 connected between one end of the resistor R2 and the first power supply terminal Vcc. The third inverter circuit INV3 includes a CMOS inverter circuit made up of n- and p-channel MOS transistors N5 and P2 connected between the first and second power supply terminals Vcc and GND in series. The gates of the transistors N5 and P2 are both connected to the input terminal DI; while the common drains of the transistors N5 and P2 are connected to the fourth inverter circuit INV4. Like the above inverter circuit INV3, each of the inverter circuits INV4 to INV8 comprises a CMOS inverter circuit made up of n- and p-channel MOS transistors (the former and latter will be hereinafter referred to as the NMOS and PMOS transistors, respectively) connected between the first and second power supply terminals Vcc and GND. The gates of the PMOS and NMOS transistors of each of the fourth and eighth inverter circuits INV4 to INV8 are connected to the common drains of the PMOS and NMOS transistors of the inverter circuit of the preceding stage or to the delay circuit at the preceding stage; while the common drains of these NMOS and PMOS transistors of each inverter circuit are connected to the gates of the NMOS and PMOS transistors of the inverter circuit of the next stage or to the delay circuit at the next stage. With such an arrangement, the delay means DM recognizes that a voltage appearing at the input terminal DI has a high or low level and after passage of a predetermined delay time from the recognition of the level, outputs the recognized level voltage to the output terminal DO. The aforementioned NAND circuit NAND has an output terminal ND0 connected to the input terminal RI of the reference voltage generation means RVGC, a first input terminal ND1 connected to the drain of the transistor P9 in the second inverter circuit INV2, a second input terminal ND2 connected to the output terminal DO of the delay means DM, and a third input terminal ND3 connected to the drain of the transistor P8 in the first inverter circuit INV1. The NAND circuit NAND is also made up of n-channel MOS transistors N6 to N8 and p-channel MOS transistors P3 to P5. The gates of the transistors P3 and N6 are connected to the input terminal NI1, while the gates of the transistors P5 and N8 are connected to the second input terminal ND2. Further, the sources of the transistors P3 to P5 are commonly connected to each other and then the output terminal NO3 and also connected to the second power supply terminal GND through the transistors N6 to N8 connected in series. With such an arrangement, the NAND circuit NAND outputs a voltage of 0 V to the output terminal NO only when all the voltages at the first to third input terminals ND1 to ND3 are 5 V, and otherwise outputs a voltage of 5 V to the output terminal ND0.

The first output stage OS1 includes a p-channel MOS transistor P6 having a source connected to the first power supply terminal Vcc and a drain and a connected to the output terminal Vout and a gate. It also includes an n-channel MOS transistor N9 having a source connected to the second power supply terminal GND and a drain connected to the output terminal Vout and a gate.

The second output stage OS2 includes a p-channel MOS transistor P7 having a source connected to the first power supply terminal Vcc and a drain connected to the output terminal Vout and a gate. It also includes an n-channel MOS transistor N10 having a source connected to the second power supply terminal GND and a drain connected to the output terminal Vout and a gate. Through the first and second output stages OS1 and OS2, a capacitive load connected to the output terminal Vout is charged and discharged. This causes the voltage appearing at the output terminal Vout to vary.

The above delay circuit DEL1 is made up of a resistor R3 connected between the gate of the transistor P6 and the gate of the transistor P7, a capacitor C3 connected between the gate of the transistor P7 and the first power supply terminal Vcc, a resistor R4 connected between the gate of the transistor N3 and the gate of the transistor N4, and a capacitor C4 connected between the gate of the transistor N10 and the first power supply terminal Vcc. With such an arrangement, the gate voltage of the transistor P7 is varied after the passage of a predetermined delay time from the change of the gate voltage of the transistor P6; while the gate voltage of the transistor N10 is varied after the passage of a predetermined delay time from the change of the gate voltage of the transistor N9. For this reason, when the transistors P6 and P7 are both turned ON, the transistor P6 is first turned ON and after the passage of a predetermined time therefrom the transistor P7 is turned ON. Further, when the transistors N9 and N10 are both turned ON, the transistor N9 is first turned ON and after the passage of a predetermined time therefrom the transistor N10 is turned ON. Accordingly, since the output voltage varies slowly with time, a variation in the power voltage caused by a variation of the output voltage can be suppressed.

The above inverter circuit INV1 is made up of a p-channel MOS transistor P8 having a gate connected to the input terminal Vin and a source connected to the first power supply terminal Vcc and a drain connected to the gate of the transistor P6 as well as an n-channel MOS transistor N11 having a gate connected to the input terminal Vin and a source connected to the second power supply terminal GND and a drain connected to the gate of the transistor N9. With such an arrangement, a voltage out of phase with respect to an input signal applied to the input terminal Vin is applied to the first and second output stages OS1 and OS2. It is considered that two stages of inverters connected in series, i.e., the first inverter circuit and the first or second output stage OS1 or OS2 are connected between the input and output terminals Vin and Vout. For this reason, the output circuit 10 of FIG. 4 is considered to be a so-called buffer circuit which outputs an output signal having the same phase as the level of an input signal.

The above inverter circuit INV2 is made up of a p-channel MOS transistor P9 having a gate connected to the output enable terminal e,ovs/OE/ and a source connected to the first power supply terminal Vcc and a drain connected to the first input terminal ND1 of the NAND circuit NAND as well as an n-channel MOS transistor N12 having a gate connected to the output enable terminal $\overline{OE}$ and a source connected to the second power supply terminal GND and a drain connected to the drain of the transistor P9. With such an arrangement, such a signal can be generated that is out of phase with respect to the output enable signal necessary for the circuit operation. The above delay circuit DEL2 is made up of a p-channel MOS transistor P10 having a gate connected to the output enable terminal $\overline{OE}$ and a source connected to the drain of the transistor P8 and a drain connected to the drain of the transistor N11 as well as an n-channel MOS transistor N13 having a gate connected to the drain of the transistor P9 and a drain connected to the drain of the transistor P8 and a source connected to the drain of the transistor N11. With such an arrangement, when the gate voltages of the transistors P6 and N9 vary, the gate voltages of the transistors P6 and N9 vary with a predetermined delay time difference therebetween caused by the delay circuit DEL2. For example, when the gate voltages of the transistors P6 and N9 vary from the low level 0 V to the high level 5 V, the voltage 5 V is first applied to the gate of the transistor P6 and after a predetermined delay time therefrom, the voltage 5 V is applied to the gate of the transistor N9. When the gate voltages of the transistors P6 and N9 vary from the high level 5 V to the low level 0 V, the voltage 0 V is first applied to the gate of the transistor N9 and after a predetermined delay time therefrom, the voltage 0 V is applied to the gate of the transistor P6. Similarly, the gate voltage is applied even to the transistors P7 and N10 at the similar timing to the above. Accordingly, since a set of the transistors P6 and N9 and a set of the transistors P7 and N10 are not turned ON at the same time at any time, no through current will flow.

The aforementioned bias circuit BIAS is made up of a p-channel MOS transistor P11 having a gate connected to the drain of the transistor P9 and a source connected to the first power supply terminal Vcc and a drain connected to the gate of the transistor P6 as well as an n-channel MOS transistor N14 having a gate connected to the output enable terminal $\overline{OE}$ and a drain connected to the gate of the transistor N9 and a source connected to the second power supply terminal GND. With such an arrangement, when the output enable signal is at a high level of 5 V, such a voltage that the transistors P6, P7, N9 and N10 in the first and second output stages are turned OFF is supplied to the gate of these transistors. For this reason, when the output enable signal is at the high level 5 V, the output terminal Vout is put in its high impedance state.

All the p- and n-channel MOS transistors of the output circuit 10 can have an identical threshold voltage Vth of 0.7 V, though the present invention is not specifically limited to the specific example.

Figure 5:
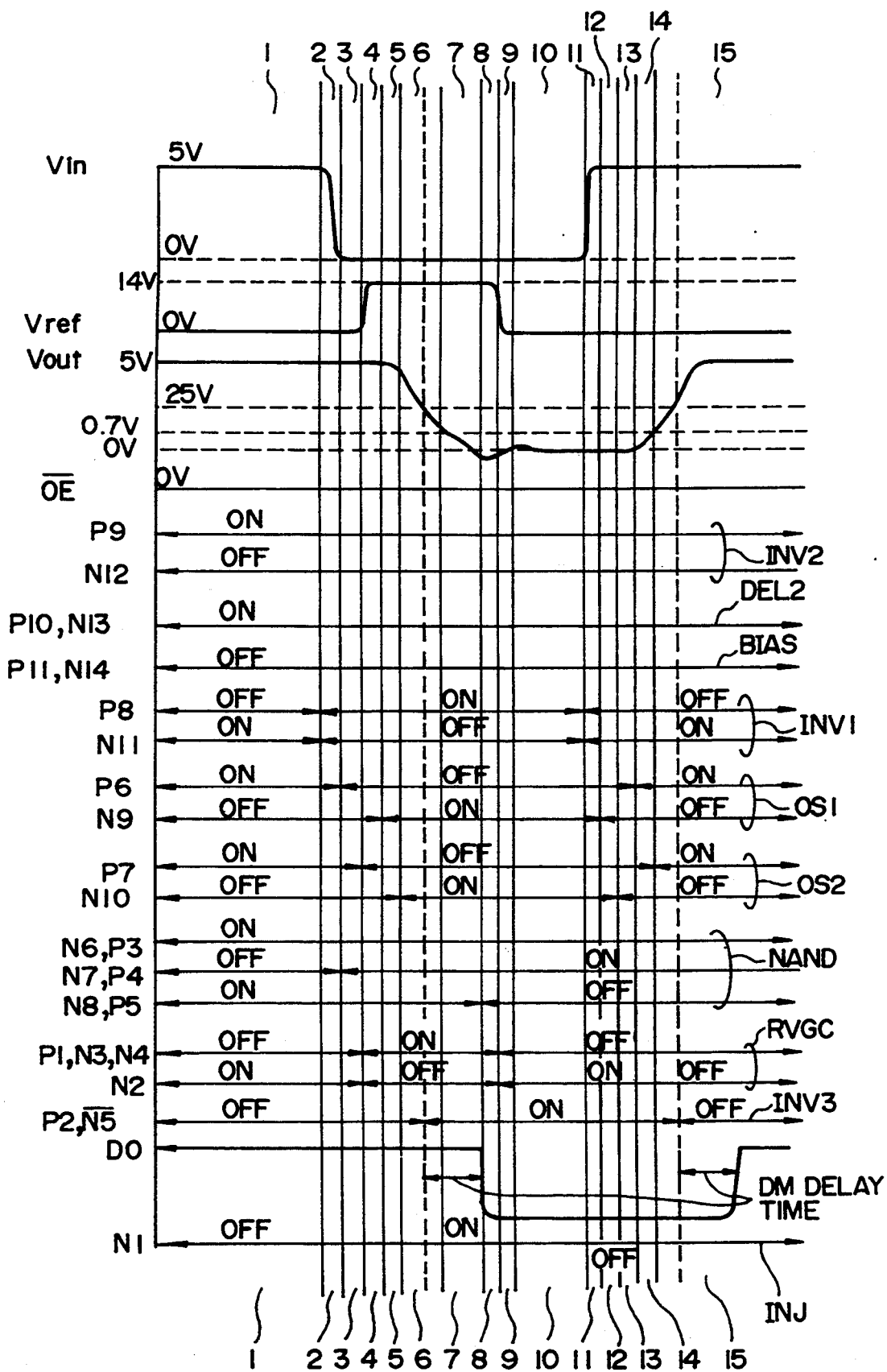
FIG. 5 is a timing chart for explaining the operation of the output circuit of FIG. 4.

The operation of the output circuit 10 of FIG. 4 will next be explained by referring to FIG. 5. Consider a period after an input signal applied to the input terminal Vin varies from the high level 5 V to the low level 0 V until the input signal varies again to the high level 5 V. The period is divided into durations 1 to 15. FIG. 5 shows, in the above durations 1 to 15, the gate voltage (reference voltage) Vref of the transistor N1, a voltage appearing at the output terminal Vout, a voltage appearing at the output enable terminal $\overline{OE}$, the ON/OFF states of all the transistor elements (transistors N1 to N14 and P1 to P11) of the output circuit 10, and a voltage appearing at the output terminal DO of the delay means. In FIG. 4, mark '-' attached to the top of each symbol means to an inversion of the state of the signal etc., marked by the symbol. For example, when N5 in FIG. 5 is in its ON state, the transistor N5 in FIG. 4 comes to be in its OFF state. In the durations 1 to 15, the output enable signal is set at the low level 0 V. Accordingly, the transistor P9 of the inverter circuit INV2 is kept in the ON state and the transistor N12 is in the OFF state in the durations 1 to 15. Thus, the transistor P3 of the NAND circuit NAND is in the OFF state and the transistor N6 is in the ON state in the durations 1 to 15. Further, the transistors P10 and N13 of the delay circuit DEL2 are kept in the ON state in the durations 1 to 15. Further, the transistors P11 and N14 of the high output impedance setting means BIAS are set to be in the OFF state in the durations 1 to 15.

More specifically, first, in the duration 1, the input signal has a level of 5 V and the output signal has a level of 5 V. The transistor P8 of the input inverter circuit INV1 is in the OFF state, while the transistor N11 is in the ON state. The transistor P2 of the inverter circuit INV3 is in the OFF state, the transistor N5 is in the ON state, and the voltage appearing at the output terminal DO of the delay means is at 5 V. The transistor P4 of the NAND circuit NAND is in the ON state, the transistors P3 and P5 are in the OFF state, the transistor N7 is in the OFF state, and the transistors N6 and N8 are in the ON state. This results in that the output signal of the NAND circuit is set at a level of 5 V. Accordingly, the transistor N2 of the reference voltage generation circuit RVGC is in the ON state, and the transistors P1, N3 and N4 are in the OFF state. Since the output signal of the reference voltage generation circuit RVGC is at 0 V, the transistor N1 is in the OFF state. The transistor N1 includes an enhancement type transistor, though not specifically restricted to the specific example.

In the duration 2, next, the input signal starts to fall toward its low level 0 V. For this reason, when the input signal becomes smaller than the logical threshold value of the inverter circuit INV, this causes the transistor P8 of the input inverter circuit INV to be turned ON while the transistor N11 to be turned OFF.

In the next duration 3, the gate potential of the transistor P6 of the first output stage OS1 is increased in response to the turning-ON of the transistor P8, so that, when the gate potential is larger than the threshold voltage of the transistor P6, the transistor P6 is turned OFF. Further, the gate voltage of the transistor P4 of the NAND circuit NAND is increased in response to the turning-ON of the transistor P8, so that, when the gate voltage is larger than the threshold voltage of the transistor P4, the transistor P4 is turned OFF. Furthermore, the gate voltage of the transistor N7 of the NAND circuit NAND is increased in response to the turning ON of the transistor P8, so that, when the gate voltage is larger than the threshold voltage of the transistor N7, the transistor N7 is turned ON. Accordingly, the NAND circuit NAND outputs a low level voltage of 0 V to the output terminal ND0.

Next, in the duration 4, after the passage of a predetermined delay time determined by the delay circuit DEL1 from a change of the gate potential of the transistor P6 of the output stage OS2 larger than the threshold voltage of the transistor P6, the gate potential of the transistor P7 becomes larger than the threshold voltage of the transistor P7, so that the transistor P7 is turned OFF. In the duration 4, the transistors P6, P7, N9 and N10 of the output stages OS1 and OS2 are all put in the OFF state. This enables prevention of a through current during change of the input signal. Further, since the low level voltage 0 V is applied to the input terminal RI of the reference voltage generation circuit RVGC, the transistor N2 is turned OFF and the transistors P1, N3 and N4 are turned ON. As a result, the reference voltage Vref appearing at the output terminal RO of the reference voltage generation circuit is set at twice a predetermined voltage determined by the ON resistance of the transistors P1, N3 and N4, for example, at twice its threshold value, that is, at 1.4 V.

In the duration 5, next, the drain voltage of the transistor P8 is transmitted to the gate of the transistor N9 after the passage of a predetermined delay time determined by the delay circuit DEL2 and the drain voltage becomes larger than the threshold voltage of the transistor N9, so that the transistor N9 is turned ON. This causes electric charges so far accumulated in the capacitive load connected to the output terminal Vout to be discharged through the transistor N9, so that the output signal appearing at the output terminal Vout starts to drop from 5 V. In this connection, it is assumed that since the accumulated electric charges are discharged only through the transistor N9, the load driving capability of the output circuit is small. For this reason, when the output voltage falls, no ground bounce takes place. The ground bounce is referred to as such a phenomenon that the second power voltage within the output circuit 10 set to be 0 V is increased.

In the next duration 6, the drain voltage of the transistor N9 is transmitted to the gate of the transistor N10 after the passage of a predetermined delay time determined by the delay circuit DEL1 and the drain voltage becomes larger than the threshold voltage of the transistor N10, so that the transistor N10 is turned ON. This causes electric charges so far accumulated in the capacitive load connected to the output terminal Vout to be discharged through the transistors N9 and N10. Thus, the current driving capability of the output circuit 10 is considered to be larger than that in the duration 5 and therefore the output signal can be varied at high speed. Further, since the output signal is smaller than the logical threshold value of the inverter circuit INV3, the transistor P2 is turned ON and the transistor N5 is turned OFF.

In the next duration 7, since the output voltage appearing at the output terminal Vout becomes 0.7 V that corresponds to (the reference voltage 1.4 minus the threshold voltage 0.7 V of the transistor N1), the transistor N1 of the current injection means INJ is turned ON. This causes the turned ON transistor N1 to supply charges to the output terminal Vout. As a result, electric charges to be discharged from the capacitive load become less by an amount corresponding to the electric charges supplied to the output terminal Vout through the transistor N1, and thus the load driving capability of the output circuit becomes smaller than that in the duration 6. Accordingly, a current to be discharged from the capacitive load becomes small and thus the generation of undershoot in the output signal can be suppressed.

In the next duration 8, after the inverter circuit INV3 of the delay means DM recognizes that the voltage on the input terminal DI is at its low level, a predetermined delay time elapses, for which reason a low level voltage 0 V appears at the output terminal DO. Thus, the transistor P5 is turned ON and the transistor N8 is turned OFF, so that the high level voltage 5 V appears on the output terminal of the NAND circuit NAND. In this connection, the predetermined delay time determined by the delay means DM is determined substantially by a sum of delay times of the inverter circuits INV3 to INV8 and delay circuits DEL3 and DEL4. For example, when each of the inverter circuits INV3 to INV8 has a delay time of 0.5 nsec. and each of the delay circuits DEL3 and DEL4 has a delay time of 1 nsec., the delay time of the delay means DM becomes 5 nsec. Further, the delay time of the delay means DM should be set at such a value that the ON state of the transistor N1 can be kept until the possibility of generating undershoot in the output signal becomes zero. For this reason, the present invention is not specifically limited to such a case that the delay means DM is made up of 6 stages of the inverter circuits INV3 to INV8, and thus the number of such stages may be made even and the need for provision of the resistors R1 and R2 and the capacitors C1 and C2 may be eliminated.

In the next duration 9, the gate voltage of the transistor P1 of the reference voltage generation circuit RVGC becomes larger than its threshold voltage, the transistor P1 is turned OFF, while the gate voltage of the transistor N2 becomes larger than its threshold voltage, the transistor N2 is turned ON, so that the transistors N3 and N4 are turned OFF. As a result, the reference voltage Vref of the constant-voltage generation circuit RVGC starts to drop from 1.4 V toward 0 V.

In the next duration 10, the reference voltage Vref of the constant-voltage generation circuit RVGC is further reduced and becomes smaller than a sum of the voltage of the output signal and the threshold voltage 0.7 V of the transistor N1, so that the transistor N1 is turned OFF. Thus, electric charges accumulated in the capacitive load are discharged again through the transistors N9 and N10. The driving capability of the output circuit 10 becomes as large as in the duration 6. However, since the output voltage drops to the vicinity of 0 V and the amount of electric charges accumulated in the capacitive load is small, no undershoot takes place even when the load driving capability becomes large.

In the duration 10, since no operating currents flow through the transistors P1, N3 and N4, the power consumption becomes small.

In the next duration 11, the input signal is changed to the high level 5 V. This causes the transistor P8 of the input inverter circuit INV1 to be turned OFF while the transistor N11 to be turned ON.

In the next duration 12, the change of the transistor N11 to its ON state causes the gate potential of the transistor N9 of the first output stage OS1 to drops and become smaller than the threshold voltage of the transistor N9, which results in that the transistor N9 is turned OFF.

In the next duration 13, the gate potential of the transistor N9 is supplied to the gate of the transistor N10 of the second output stage OS2 after the passage of a predetermined delay time determined by the delay circuit DEL1. Since the gate voltage of the transistor N10 becomes smaller than the threshold voltage of the transistor N10, the transistor N10 is turned OFF. In the duration 13, all the transistors N9, N10, P6 and P7 are in the OFF state. As a result, variations in the power voltage caused by variations in the output signal can be suppressed.

In the next duration 14, the gate voltage of the transistor N9 is transmitted to the gate of the transistor P6 of the first output stage OS2 after the passage of a predetermined delay time determined by the delay circuit DEL2 and the gate voltage of the transistor P6 becomes larger than the threshold voltage of the transistor P6, which results in that the transistor P6 is turned ON. Electric charges are supplied to the output terminal Vout by means of the transistor P6 and thus the capacitive load starts to be charged so that a voltage at the output terminal Vout starts to rise.

Finally, in the duration 15, the gate voltage of the transistor P6 is transmitted to the gate of the transistor P7 of the second output stage OS2 after the passage of the predetermined delay time determined by the delay circuit DEL2 and the gate voltage of the transistor P7 becomes larger than the threshold voltage of the transistor P7, so that the transistor P7 is turned ON. This causes the capacitive load to be charged by means of the transistors P6 and P7. The load driving capability of the output circuit becomes larger than that in the duration 14 and the rising rate of the output voltage becomes high. The voltage at the output terminal Vout becomes larger than the logical threshold value 2.5 V of the inverter circuit INV3 and the delay means recognizes that the signal level at the input terminal DI is at the high level. After the passage of the predetermined delay time determined by the delay means DM from the above recognition of the high level, the voltage at the output terminal DO of the delay means is changed to the high level 5 V.

Figure 6:
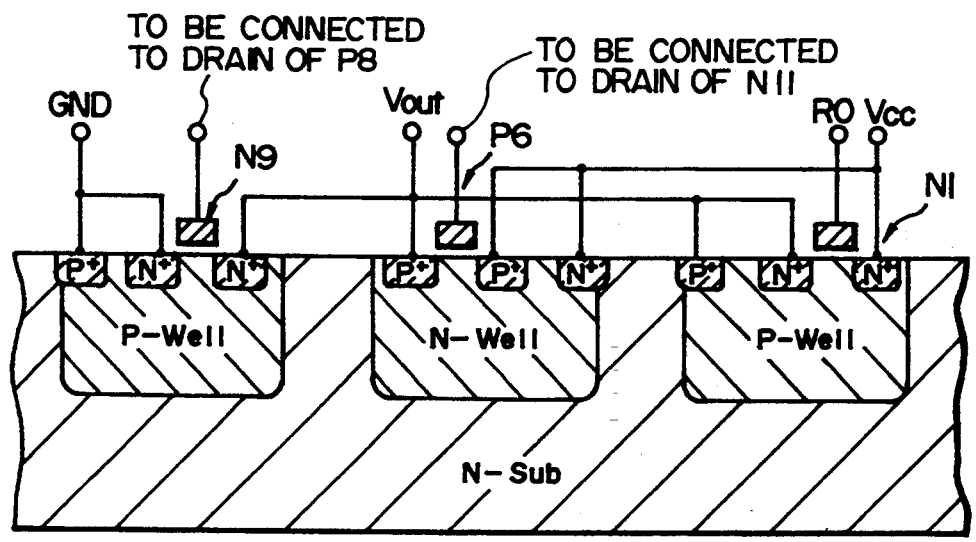
FIG. 6 is a vertical sectional view of a structure of a part of the embodiment of the present invention.

FIG. 6 shows a cross-sectional view of a structure of the transistors P6 and N9 of the first output stage OS1 and the transistor N1 of the current injection means INJ in FIG. 4 when these transistors are formed on an Si substrate. In FIG. 6, the Si substrate includes an N type substrate N-Sub containing such N type impurities as phosphorus or arsenic. Formed on the N type substrate N-Sub are P well layers P-Well and an N well layer N-Well, on which n-channel MOS transistors and a p-channel MOS transistor are formed, respectively. Formed in the P well layer P-Well are N type diffusion layers N+ which are used as source and drain parts. Also formed in the P well layer P-Well is a P type diffusion layer P+ which is higher in concentration than the P well layer P-Well from which a predetermined voltage is to be supplied to the P well layer. Formed in the N well layer N-Well are P type diffusion layers P+ which are used as source and drain parts. Also formed in the N well layer N-Well is an N type diffusion layer N+ which is higher in concentration than the N well layer N-Well from which a predetermined voltage is to be supplied to the N well layer. The respective elements formed on the Si substrate are interconnected by means of a very fine metallic wiring layer. In the drawing, for simplicity of the drawing, the wiring layer is represented by solid lines to show an interconnection relationship therebetween. More specifically, the metallic wiring layer may include not only a single layer but also a multi-layer wiring layer made up of first, second, third ... layers electrically isolated by insulating layers as necessary. The drain of the transistor N1 and the P well layers P-Well of the transistor N1 are both connected to the output terminal. The drain of the transistor N1 is connected to the first power supply terminal Vcc and the gate thereof is connected to the output terminal RO of the reference voltage generation circuit. The source of the transistor N9 and the P well layers P-Well of the transistor N9 are connected to the second power supply terminal GND. The drain of the transistor N9 is connected to the output terminal Vout, and the gate thereof is connected to the drain of the transistor P8. The source of the transistor P4 and the N well layer N-Well of the transistor P4 are both connected to the first power supply terminal Vcc. The drain of the transistor P6 is connected to the output terminal Vout and the gate thereof is connected to the drain of the transistor N11. With such a structure as mentioned above, the transistors N9 and N1 can be formed in the same step. Since the formation of the output circuit eliminates the need for a new step of forming the transistor N1 (which is one of features of the present invention), the output circuit of the present invention can be formed with use of the conventional fabricating steps and thus it can be avoided to increase its turn around time (TAT). Other n-channel MOS transistors of the output circuit of FIG. 4 not depicted in FIG. 6 can be formed in the same steps as for the transistors N9 and N1 and other p-channel MOS transistors can be formed in the same steps as for the transistor P6.

Figure 7:
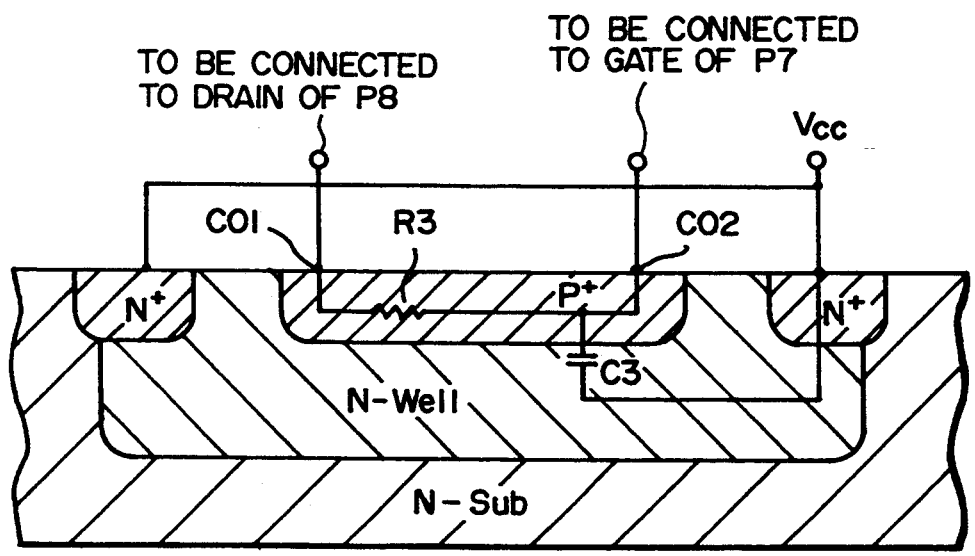
FIG. 7 is a vertical sectional view of a structure of another part of the embodiment of the present invention.

FIG. 7 shows a cross-sectional view of a structure of the resistor R3 and capacitor C3 of the delay circuit DEL1 formed on an Si substrate. In FIG. 7, the Si substrate includes an N type substrate N-Sub containing N type impurities. Formed on the N type substrate N-Sub is an N well layer N-Well on which the resistor R3 and the capacitor C3 are formed. The respective elements in FIG. 7 are connected to other elements formed on the same substrate by means of, e.g., fine metallic wires such as aluminum wires. For simplicity of the drawing, however, such metallic wires are represented by solid lines only to show its interconnection relationship. Formed in the N well layer N-Well is a P type diffusion layer P+ which functions as the resistor R3. The P type diffusion layer P+ is provided with connectors CO1 and CO2 for interconnection with other elements formed on the substrate having the P type diffusion layer P+ formed thereon. The resistance value of the resistor R3 is determined by factors such as the impurity concentration of the P type diffusion layer P+ and the distance between the connectors CO1 and CO2. The connector CO1 is connected to the gate of the transistor P7, while the connector CO2 is connected to the drain of the transistor P8. Further formed in the N well layer N-Well are N type diffusion layers N+ which are higher in concentration than the N well layer N-Well. The N type diffusion layers N+ are connected to the first power supply terminal Vcc to be supplied with, e.g., 5 V therefrom. Thus, the N well layer N-Well is biased in the reverse direction to the P type diffusion layer P+. Thus, electric charges can be accumulated in between the N well layer N-Well and P type diffusion layer P+. In other words, formed between the N well layer N-Well and P type diffusion layer P+ is the capacitor C3 having a P-N junction capacitance between the N well layer N-Well and P type diffusion layer P+. An equivalent wiring between the N type diffusion layers N+, P type diffusion layer P+ and N well layer N-Well are represented by solid lines. When the resistor R3 and the capacitor C3 are formed to have such a structure as shown in FIG. 7, the resistor R3 and capacitor C3 can be formed by the same process as the p-channel MOS transistors of the output circuit. The other resistors R1, R2 and R4 and capacitors C1, C2 and C4 of the output circuit of FIG. 4 may be formed by the same process as the resistor R3 and capacitor C3.

Figure 8:
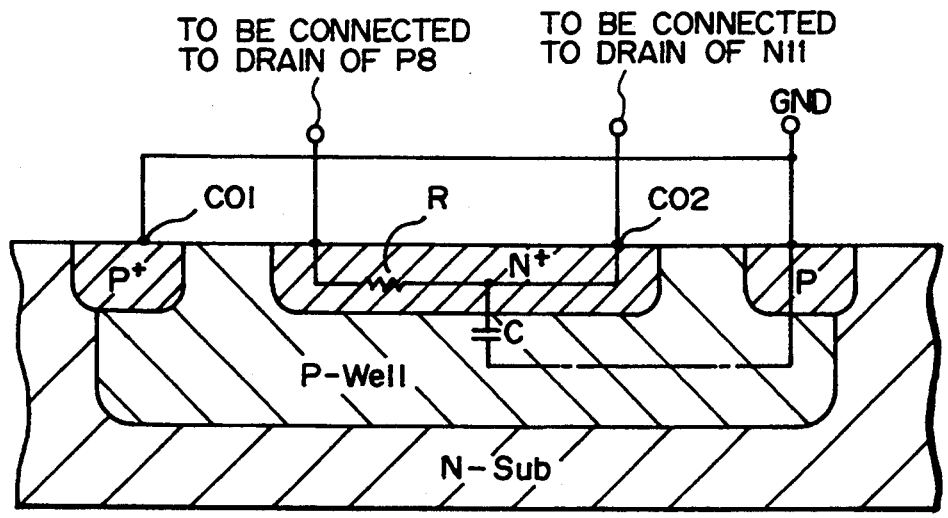
FIG. 8 is a vertical sectional view of a structure of yet another part of the embodiment of the present invention.

FIG. 8 shows a cross-sectional view of a structure when a resistor R is formed as an N type diffusion layer. In FIG. 8, an Si substrate includes an N type substrate N-Sub containing N type impurities. Formed on the N type substrate is a P well layer P-Well on which a resistor R and a capacitor C are formed. Elements in FIG. 8 are interconnected with other elements than those shown in FIG. 8 formed on the same substrate by means of a very fine metallic wiring layer. For simplicity of the drawing, however, such interconnection relationships are represented merely by solid lines. Formed in the P well layer P-Well is an N type diffusion layer N+ which functions as a resistor R. The N type diffusion layer N+ is provided with connectors CO1 and CO2 for interconnection with other elements formed on the same substrate as formed thereon with P well layers P-Well. The resistance value of the resistor R is determine by factors such as the impurity concentration of the N type diffusion layer N+ and the distance between the connectors CO1 and CO2. Also formed in the P well layer P-Well are P type diffusion layers P+. The P type diffusion layers P+ are connected to the second power supply terminal GND to be supplied with, for example, 0 V therefrom. Thus, the N type diffusion layer N+ is biased in the reverse direction to the P well layer P-Well. Accordingly, electric charges can be accumulated in between the N type diffusion layer N+ and the P well layer P-Well. As a result, a capacitor C having a P-N junction capacitance between the P well layer P-Well and the N type diffusion layer N+ is formed between the N type diffusion layer N+ and the P well layer P-Well. That is, an equivalent wiring line associated with the above capacitor within the N type diffusion layer N+, P type diffusion layers P+ and P well layer P-Well are represented by a solid line. The resistors R1 to R4 and capacitors C1 to C4 of the output circuit of FIG. 4 can be formed by the same fabricating process as for the resistor R and capacitor C of FIG. 8. When the resistor and capacitor are formed to have such a structure as shown in FIG. 8, these elements can be formed by the same process as for the n-channel MOS transistors of the output circuit.

The structure of FIG. 8 is different from the structure of FIG. 7 in that the P type diffusion layer is used as the resistor in FIG. 7 while the N type diffusion layer is used as the resistor in FIG. 8. When the P type diffusion layer of FIG. 7 has the same impurity concentration as the N type diffusion layer of FIG. 8, the P type diffusion layer is larger than the N type diffusion layer with respect to their resistive value per unit volume. For this reason, for the purpose of providing a high packing density, it is advantageous to employ the P type diffusion layer as the resistor.

Figure 9:
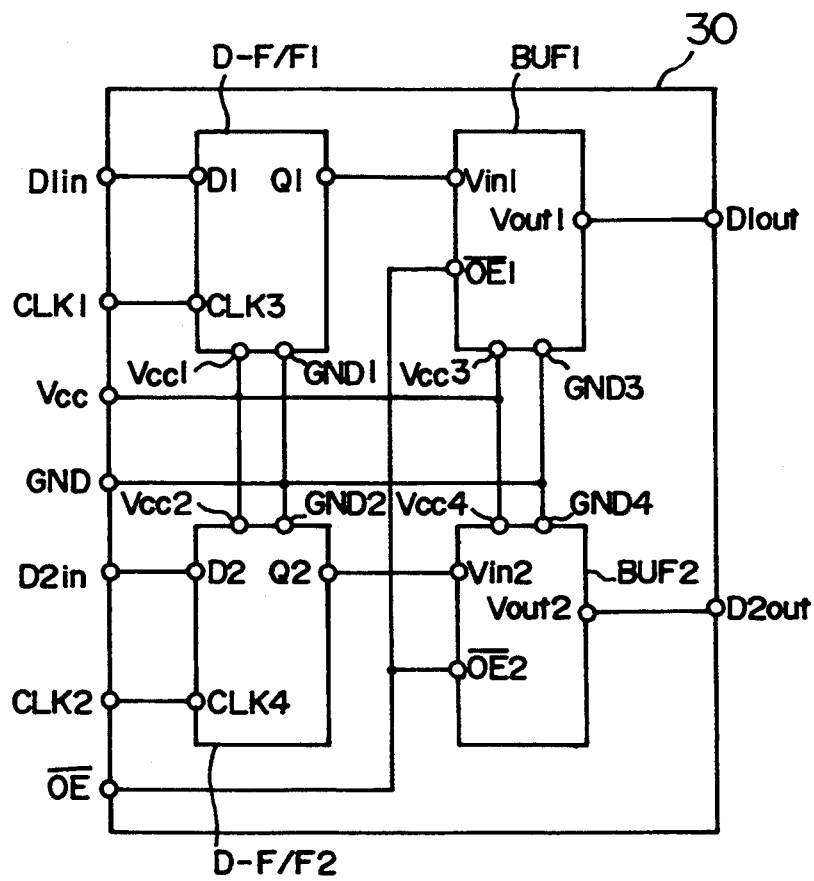
FIG. 9 is an arrangement of a bus buffer semiconductor integrated circuit using the output circuit of the present invention.

Referring now to FIG. 9, there is shown a block diagram of a bus buffer semiconductor integrated circuit 30 to which the output circuit of the present invention is applied. The illustrated bus buffer semiconductor integrated circuit can latch a 2-bit signal and can drive the signal onto a wiring line connected to the bus buffer semiconductor integrated circuit. Explanation will first be made as to the arrangement of the bus buffer semiconductor integrated circuit 30 of FIG. 9. The bus buffer semiconductor integrated circuit 30 has input terminals D1in and D2in, clock terminals CLK1 and CLK2, a power supply terminal Vcc, a grounding terminal GND, an output enable terminal $\overline{OE}$, and output terminals D1out and D2out. The bus buffer semiconductor integrated circuit 30 includes D type flip-flop circuits D-F/F1 and D-F/F2 and output circuits BUF1 and BUF2. In more detail, the D type flip-flop circuit D-F/F1 has an input terminal D1, a clock terminal CLK3, a power supply terminal Vcc1, a grounding terminal GND1 and an output terminal Q1; while the D type flip-flop circuit D-F/F2 has an input terminal D2, a clock terminal CLK4, a power supply terminal Vcc2, a grounding terminal GND2 and an output terminal Q2. Meanwhile, the output circuit BUF1 has an input terminal Vin1, an output enable terminal $\overline{OE1}$, a power supply terminal Vcc3, a grounding terminal GND3 and an output terminal Vout1; while the output circuit BUF2 has an input terminal Vin2, an output enable terminal $\overline{OE2}$, a power supply terminal Vcc4, a grounding terminal GND4 and an output terminal Vout2. The input terminal D1 is connected to the input terminal D1in and the input terminal D2 is connected to the input terminal D2in. The clock terminal CLK3 is connected to the clock terminal CLK1, while the clock terminal CLK4 is connected to the clock terminal CLK2. The power supply terminals Vcc1 to Vcc4 are connected to the power supply terminal Vcc, while the grounding terminals GND1 to GND4 are connected to the grounding terminal GND. The output enable terminals $\overline{OE1}$ and $\overline{OE2}$ are both connected to the output enable terminal $\overline{OE}$. The input terminal Vin1 is connected to the output terminal Q1, while the input terminal Vin2 is connected to the output terminal Q2. The output terminal Vout1 is connected to the output terminal D1out, while the output terminal Vout2 is connected to the output terminal D2out. The output circuits BUF1 and BUF2 include such an output circuit 10 as shown in FIG. 4. More specifically, the input terminal Vin1, output enable terminal $\overline{OE1}$, power supply terminal Vcc3, grounding terminal GND3 and output terminal Vout1 in the output circuit BUF1 of FIG. 9 correspond to the input terminal Vin, output enable terminal $\overline{OE}$, first power supply terminal Vcc, second power supply terminal GND and output terminal Vout in the output circuit 10 of FIG. 4, respectively. Similarly, the input terminal Vin2, output enable terminal $\overline{OE2}$, power supply terminal Vcc4, grounding terminal GND4 and output terminal Vout2 in the output circuit BUF2 of FIG. 9 correspond to the input terminal Vin, output enable terminal $\overline{OE}$, first power supply terminal Vcc, second power supply terminal GND and output terminal Vout in the output circuit 10 of FIG. 4, respectively. Each of the above D type flip-flop circuits D-F/F1 and D-F/F2 is a generally well-known D type flip-flop circuit which reads an input signal at the timing of a rising or falling edge in an input clock and generates an output signal based on the input signal, though these circuits are not shown in detail in the drawing.

Figure 10:
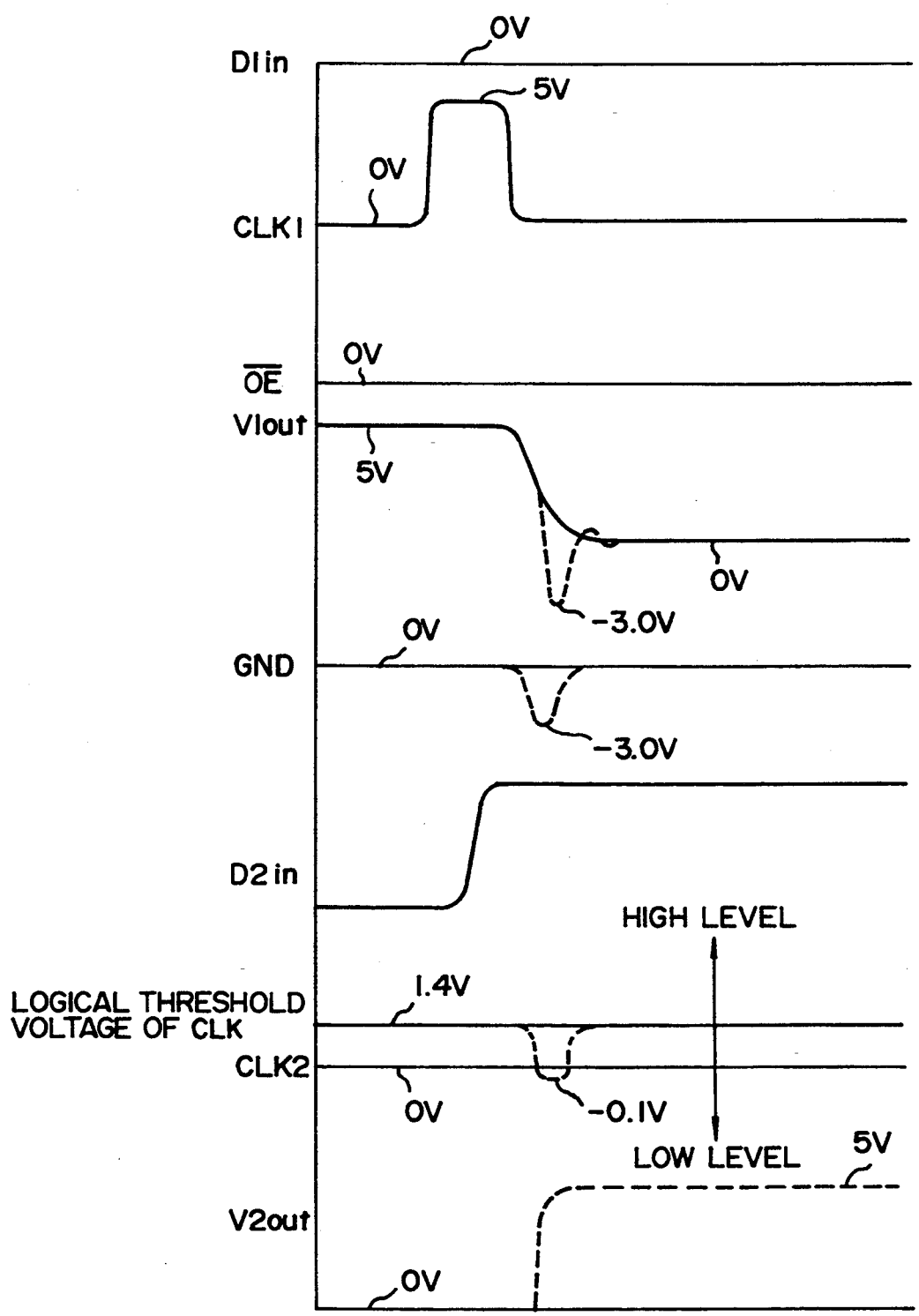
FIG. 10 is a timing chart for explaining the operation of the integrated circuit of FIG. 9.

Next, explanation will be directed to the operation of the bus buffer semiconductor integrated circuit 30 of FIG. 9, by referring to FIG. 10.

Shown in FIG. 10 is a timing chart of a voltage appearing at the input terminal D1in, a voltage appearing at the clock terminal CLK1, a voltage on the output enable terminal $\overline{OE}$, a voltage on the output terminal Vout1, a voltage on the grounding terminal GND, a voltage on the input terminal D2in, a voltage on the clock terminal CLK2, a threshold voltage of the D type flip-flop circuit D-F/F2 with respect to the voltage of the clock terminal CLK2, and a voltage on the output terminal V2out. Solid lines given in FIG. 10 show waveforms of voltage transitions when the present invention is applied, while dotted lines shows waveforms of voltage transitions when the present invention is not applied.

Consider as the initial state of the bus buffer semiconductor integrated circuit 30 that an input signal at the input terminal D1in has a low level of 0 V, an output enable signal applied to the output enable terminal $\overline{OE}$ is at 0 V as its logical value "1", an output signal applied to the output terminal D1out is at a high level of 5 V, an input signal applied to the input terminal D2in is at a low level of 0 V, an output signal applied to the output terminal D2out is at a low level of 0 V, and a clock signal of low level of 0 V is applied to the clock terminals CLK1 and CLK2.

Under such conditions, when a clock signal of high level of 5 V is applied to the clock terminal CLK1, the D type flip-flop circuit D-F/F1 reads the signal level of 0 V of the input terminal D1in at the moment the clock signal is changed, and provides an output signal of 0 V to the output terminal Q1. This causes an output signal of the output circuit BUF1 at the output terminal Vout1 to fall from 5 V toward 0 V. At this time, since the output circuit of the present invention is used in the output circuit BUF1 of the bus buffer semiconductor integrated circuit 30, no undershoot will take place in the output signal at the output terminal Vout1. Thus, the grounding voltage will not be fluctuated. Further, the clock signal applied to the clock terminal CLK2 of the D type flip-flop circuit D-F/F2 keeps its low level of 0 V during such a time period as shown in FIG. 10, so that, even when an input signal D2 for the D type flip-flop circuit D-F/F2 is changed to the high level of 5 V during the period of FIG. 10, an output signal at the output terminal D2out will maintain the 0 V level at its initial state without change. However, in the case where, as the output circuits BUF1 and BUF2 of FIG. 9, the output circuit of the present invention is not employed but such a prior art output circuit not having a function of preventing undershoot generation or not capable of sufficiently suppressing the undershoot generation is employed; when a rising change in the clock signal CLK1 causes the signal of the output terminal D1out to fall from 5 V to 0 V, undershoot will take place in the signal appearing at the output terminal D1out. This causes the voltage of the output terminal D1out is reduced to a level smaller than 0 V, e.g., to −3.0 V (shown by a dotted line in the voltage D1out of FIG. 10). This also causes the voltage of the grounding terminal GND to be temporarily reduced to a level smaller than 0 V, e.g., to −3.0 V (shown by a dotted line in the voltage GND of FIG. 10). For this reason, the threshold voltage of the D type flip-flop circuit D-F/F2 with respect to the voltage of the clock terminal CLK2 or in other words, the voltage (which is normally set at, e.g., 1.4 V) for recognition of the high level voltage of the clock terminal CLK2, is reduced, for example, by 1.5 V due to the drop of the grounding potential and thus reduced to −0.1 V (shown by a dotted line in the voltage CLK2 of FIG. 10). Thus, in spite of the fact that the voltage of the clock terminal CLK2 is at the low level of 0 V, the D type flip-flop circuit D-F/F2 erroneously recognizes the voltage of the clock terminal CLK2 is at the high level. As a result, the D type flip-flop circuit D-F/F2 takes in the high level voltage 5 V of the input terminal V2in and outputs the high level voltage 5 V to the output terminal Q2. Thus, this causes the output signal of the output terminal Vout2 of the output circuit BUF2 to vary from 0 V to 5 V, whereby the bus buffer semiconductor integrated circuit 30 is erroneously operated (shown by a dotted line in the voltage V2out of FIG. 10). In the illustrated example, it is assumed that, when the voltage of the grounding terminal GND drops, the threshold voltage with respect to the voltage of the clock terminal CLK2 is reduced by an amount corresponding to about half the drop voltage. Thus, when the voltage of the grounding terminal GND drops by 3V, the threshold voltage with respect to the voltage of the clock terminal CLK2 is reduced by 1.4 V–1.5 V to −0.1 V.

When the output circuit of the present invention is used in the bus buffer semiconductor integrated circuit 30 as has been explained in the foregoing, the erroneous operation of the D type flip-flop circuits within the bus buffer semiconductor integrated circuit caused by undershoot generation can be prevented.

Figure 11:
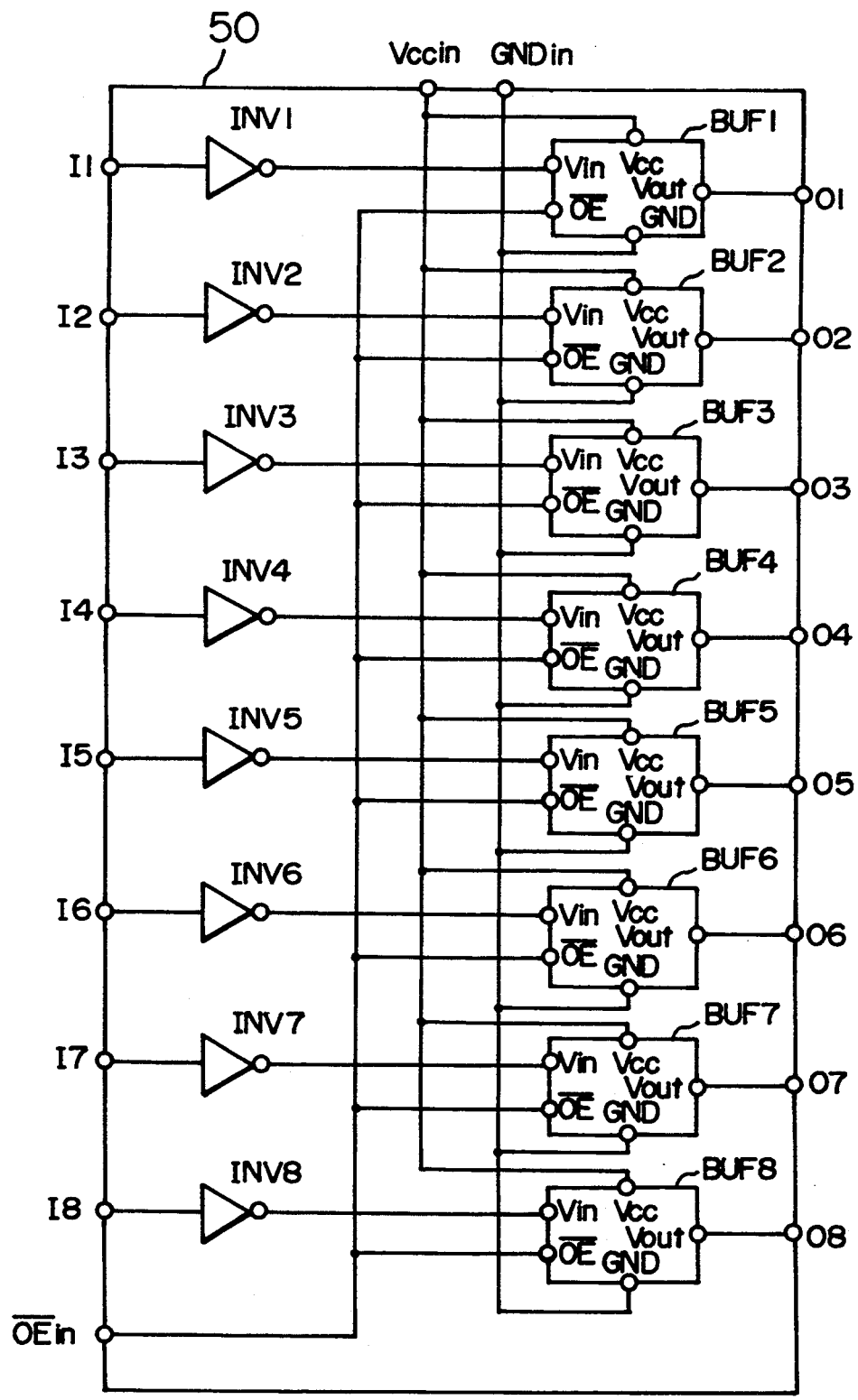
FIG. 11 is an arrangement of another bus buffer semiconductor integrated circuit using the output circuit of the present invention.

Shown in FIG. 11 is another embodiment of the bus buffer semiconductor integrated circuit to which the output circuit of the present invention is applied. A bus buffer semiconductor integrated circuit 50 shown in FIG. 11 includes a so-called octal-inverted integrated circuit (IC) which has a function of inverting an 8-bit input signal and driving the inverted input signal in its predetermined direction. Explanation will be made as to an arrangement of the bus buffer semiconductor integrated circuit 50. More specifically, the bus buffer semiconductor integrated circuit 50 has input terminals I1 to I8 for data input, output terminals O1 to O8 for data output, an output enable terminal $\overline{OEin}$ for input of an output enable signal, a power supply terminal Vccin through which a first power voltage is supplied, and a power supply terminal GNDin through which a second power voltage is supplied. Also included in the bus buffer semiconductor integrated circuit are eight output circuits BUF1 to BUF8 having the same configuration as the output circuit of FIG. 4 as well as eight inverter circuits INV1 to INV8. Each of the output circuits BUF1 to BUF8 of the bus buffer semi-conductor integrated circuit has an input terminal Vin, an output terminal Vout, an output enable terminal $\overline{OEin}$ and first and second power supply terminals Vcc and GND, which correspond to the input terminal Vin, output terminal Vout, output enable terminal $\overline{OE}$, first and second power supply terminals Vcc and GND of the output circuit of FIG. 4, respectively. The output enable terminal $\overline{OEin}$ of the output circuits BUF1 to BUF8 is connected to the output enable terminal $\overline{OE}$. For this reason, the eight output circuits BUF1 to BUF8, in response to the level of a voltage applied to the output enable terminal $\overline{OE}$, are put in its output enable state or output disable state at the same time. In other words, the output enable signal applied to the output enable terminal OE is supplied to the output circuits BUF1 to BUF8 at the same time, so that, when the output enable signal $\overline{OE}$ is at its low level of, e.g., 0 V, all the output circuits BUF1 to BUF8 can output their signals to their output terminals O1 to O8, whereby the bus buffer semiconductor integrated circuit 50 can transmit an 8-bit signal. The power supply terminals Vcc and GND of the output circuits BUF1 to BUF8 are respectively commonly connected to the power supply terminals Vccin and GNDin. The input terminals Vin of the output circuits BUF1 to BUF8 are connected to the input terminals I1 to I8 through the inverter circuits INV1 to INV8, respectively. The output terminals Vout of the output circuits BUF1 to BUF8 are connected to the output terminals O1 to O8, respectively. For example, the input terminal Vin of the output circuit BUF1 is connected to the input terminal I1 through the inverter circuit INV1; while the output terminal Vout of the output circuit BUF1 is connected to the output terminal O1.

As has been explained above, the present invention can prevent generation of undershoot in the output signals of the output circuits BUF1 to BUF8. Accordingly, when the aforementioned bus buffer semi-conductor integrated circuit is employed to form a system, the need for troublesomely attaching an external resistor for undershoot prevention to the output terminal of the bus buffer semi-conductor integrated circuit can be removed. Further, since the bus buffer semi-conductor integrated circuit in accordance with the present invention can prevent ringing secondarily generated after generation of undershoot, generation of any electromagnetic resonance phenomenon (EMI) can be suppressed. Thus, in order to avoid the influences of the electromagnetic resonance phenomenon (EMI) by the bus buffer semi-conductor integrated circuit on such a system as use the bus buffer semi-conductor integrated circuit of the invention or to the peripheral space of the system, the need for taking such a measure as shielding to the bus buffer semi-conductor integrated circuit can be eliminated. Therefore, in the case where the bus buffer semi-conductor integrated circuit is used in a system; reduction in the manufacturing cost of the system, reduction in the size of the system or ease in such design as bus delay calculation can be realized.

Figure 12:
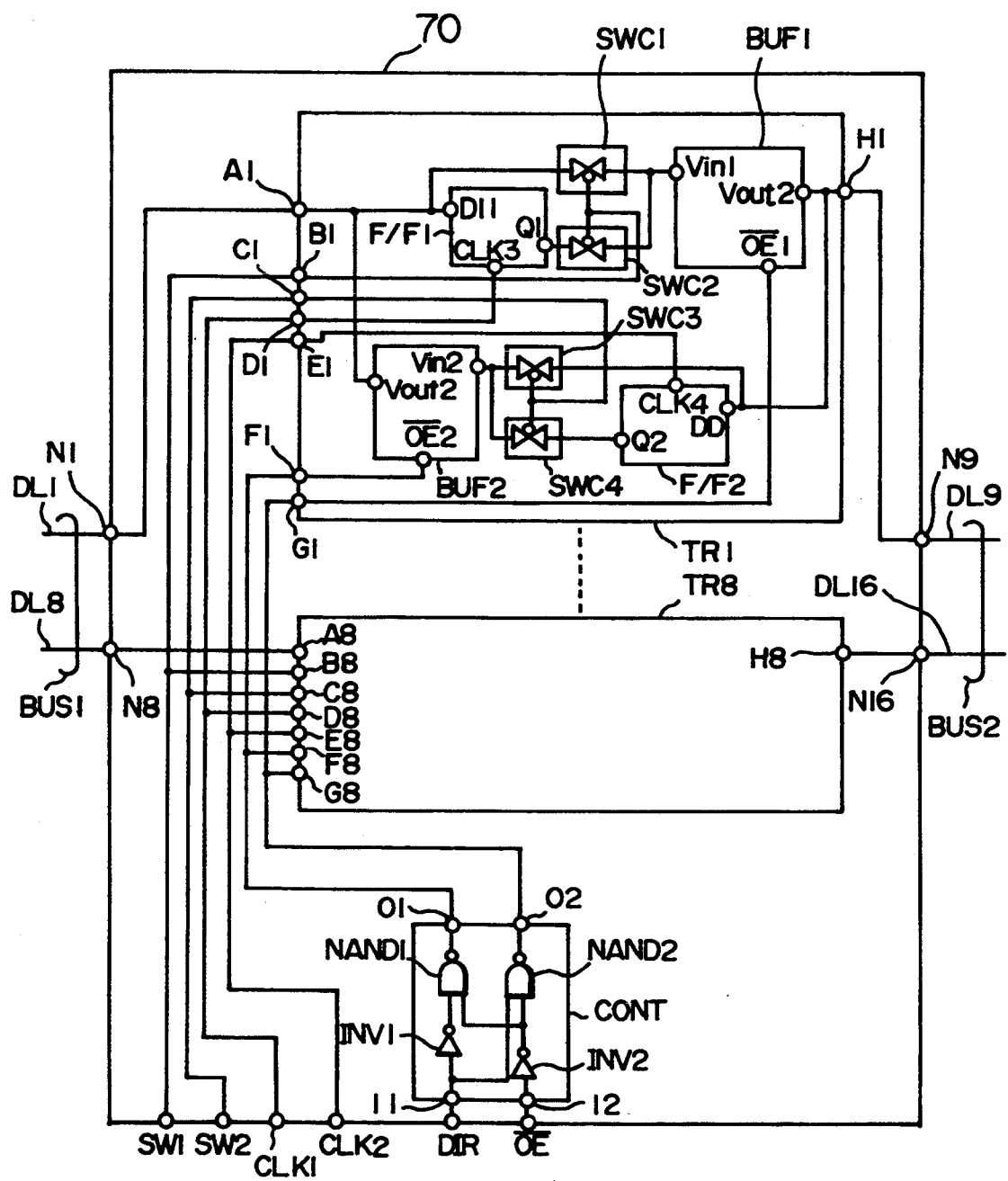
FIG. 12 is an arrangement of yet another bus buffer semiconductor integrated circuit using the output circuit of the present invention.

FIG. 12 shows another embodiment of the bus buffer semi-conductor integrated circuit using the output circuit of the present invention. A bus buffer semi-conductor integrated circuit 70 shown in FIG. 12 has a function of transmitting an 8-bit signal between two buses in both directions and selectively setting to retain a transmission signal or to pass through the transmission signal. The illustrated bus buffer semi-conductor integrated circuit 70 has first to sixteenth terminals N1 to N16, first and second switch terminals SW1 and SW2, first and second clock terminals CLK1 and CLK2, a direction terminal DIR and an output enable terminal $\overline{OE}$. The bus buffer semi-conductor integrated circuit also includes first to eighth two-way or duplex circuits TR1 to TR8 and a control circuit CONT. The first to eighth terminals N1 to N8 are connected to 8-bit signal lines DL1 to DL8 of a first bus BUS1, respectively. The ninth to sixteenth terminals N9 to N16 are connected to 8-bit signal lines DL9 to DL16 of a second bus BUS2, respectively. The first and second buses BUS1 and BUS2 are provided outside the bus buffer semi-conductor integrated circuit so that the bus buffer semi-conductor integrated circuit 70 transmits signals between the first and second buses BUS1 and BUS2 in both directions at the same time. The control circuit CONT has a first input terminal I1 connected to the direction terminal DIR, a second input terminal I2 connected to the output enable terminal $\overline{OE}$, a first output terminal O1 and a second output terminal O2. Further, the control circuit CONT includes first and second inverter circuits INV1 and INV2 and first and second NAND circuits NAND1 and NAND2. The first NAND circuit NAND1 performs NAND logical operation on an inversion of a signal at the first input terminal I1 and an inversion of a signal at the second input terminal I2, and outputs its output signal to the first output terminal O1. The second NAND circuit NAND2 performs NAND logical operation on the signal at the first input terminal I1 and the inversion of the signal at the second input terminal I2, and outputs its output signal to the second output terminal O2. The first two-way circuit TR1 has a terminal A1 connected to the first terminal N1, a terminal B1 connected to the first switch terminal SW1, a terminal C1 connected to the second switch terminal SW2, a terminal D1 connected to the first clock signal CLK1, a terminal E1 connected to the second clock terminal CLK2, a terminal F1 connected to the first output terminal O1 of the control circuit, a terminal G1 connected to the second output terminal O2 of the control circuit, and a terminal H1 connected to the ninth terminal N9. The first two-way circuit TR1 further includes first and second buffer circuits BUF1 and BUF2, first and second switch circuits SWC1BUF1 and BUF2, and first to fourth switch circuits SWC1 to SWC4. The first flip-flop circuit F/F1 has an input terminal D11 connected to the terminal A1, a clock terminal CLK3 connected to the terminal D1, and an output terminal Q1. The second flip-flop circuit F/F2 has an input terminal D12 connected to the terminal H2, a clock terminal CLK4 connected to the terminal E1, and an output terminal Q2. The first buffer circuit BUF1 has an input terminal Vin1, an output terminal Vout1 connected to the terminal H1, and an output enable terminal $\overline{OE1}$ connected to the terminal G1. The input terminal Vin1 is connected to the terminal A1 through the first switch circuit SWC1, and also connected through the second switch circuit SWC2 to the output terminal Q1 of the first flip-flop circuit F/F1. The second buffer circuit BUF2 has an input terminal Vin2, an output terminal Vout2 connected to the terminal A1, and an output enable terminal $\overline{OE2}$ connected to the terminal F1. The input terminal Vin2 is connected through the third switch circuit SWC3 to the terminal H1, and also connected through the fourth switch circuit SWC4 to the output terminal Q2 of the first flip-flop circuit F/F2. Each of the second to eighth two-way circuits TR2 to TR8 has the same structure as the first two-way circuit TR1. That is, the eighth two-way circuit TR8 has terminals A8 to H8 corresponding to A1 to H1 of the first flip-flop circuit F/F1, and functionally the same circuit as the first two-way circuit TR1 is connected between these terminals. Further, each of the first and second switch circuits SWC1 and SWC21 has a control terminal connected to the terminal B1, while each of the third and fourth switch circuits SWC3 and SWC4 has a control terminal connected to the terminal C1. The first to fourth switch circuits SWC1 to SWC4 are turned ON or OFF according to the levels of signals on these control terminals. In response to the level of a control signal at the terminal B1, the first or second switch circuit SWC1 or SWC2 is selectively turned ON. For example, when the control signal is at its high level of 5 V, the first switch circuit SWC1 is put in its OFF state while the second switch circuit SWC2 is put in its ON state. Similarly, in response to the level of a control signal at the terminal C1, the third or fourth switch circuit SWC3 or SWC4 is selectively turned ON.

Explanation will next be made as to the operation of the first two-way circuit TR1 in the bus buffer semiconductor integrated circuit 70 of FIG. 12. The second to eighth two-way circuits TR2 to TR8 are operated in substantially the same manner as the first two-way circuit TR1. In order to transmit signals on the signal lines DL1 to DL8 of the first bus BUS1 to the signal lines DL9 to DL16 of the second bus BUS2, the first two-way circuit TR1 has the first flip-flop circuit F/F1, the first buffer circuit BUF1, and the first and second switch circuits SWC1 and SWC2. In order to transmit signals on the signal lines DL9 to DL16 of the second bus BUS2 to the signal lines DL1 to DL8 of the first bus BUS1, the second two-way circuit TR2 has the second flip-flop circuit F/F2, the second buffer circuit BUF2, and the third and fourth switch circuits SWC3 and SWC4. The first flip-flop circuit F/F1 is provided to temporarily hold an input signal applied to the terminal A1 during transmission of signals from the first bus BUS1 to the second bus BUS2. The second flip-flop circuit F/F2 is provided to temporarily hold an input signal applied to the terminal H1 during transmission of signals from the second bus BUS2 to the first bus BUS1. The first and second switch circuits SW1 and SW2 are provided to select the insertion or non-insertion of the first flip-flop circuit F/F1 in the signal transmission path during the transmission of the signals from the first bus BUS1 to the second bus BUS2. The third and fourth switch circuits SW3 and SW4 are provided to select the insertion or non-insertion of the second flip-flop circuit F/F2 in the signal transmission path during the transmission of the signals from the second bus BUS2 to the first bus BUS1. For example, when it is desired to transmit signals from the first bus BUS1 to the second bus BUS2, if the first switch circuit SWC1 is in the ON state and the second switch circuit SWC2 is in the OFF state, then the first flip-flop circuit F/F1 is not inserted in the signal transmission path. The first and second buffer circuits BUF1 and BUF2 are designed to be controlled by the output signal of the control circuit so that these buffer circuits are put in the output disable state at the same time or either one of these buffer circuits is selectively put in the ON state. Therefore, such a condition will not occur that the two buffer circuits are put in the output enable state at the same time so that signals from the first bus BUS1 to the second bus BUS2 interfere with signals from the second bus BUS2 to the first bus BUS1. Shown in Table 1 below are relationships between the level (high or low) of signals at the direction terminal DIR, output enable terminal OE and output terminals O1 and O2 of the control circuit as well as the output state of the buffer circuits BUF1 and BUF2. Symbol 'H' in Table 1 denotes high level of 5 V while symbol 'L' denotes low level of 0 V. Further, asterisk '*' represents so-called 'don't care' state in which high and low levels are allowed.

TABLE 1

| DIR | $\overline{OE}$ | O1 | O2 | BUF1 | BUF2 |
| --- | --- | --- | --- | --- | --- |
| H | L | H | L | Disabled output | Enabled output |
| L | L | L | H | Enabled output | Disabled output |
| * | H | H | H | Disabled output | Disabled output |

When the signal at the output enable terminal $\overline{OE}$ is at the high level of 5 V, the operations of the first to eighth two-way circuits TR1 to TR8 are stopped at the same time, so that the signal transmission both from the first bus BUS1 to second bus BUS2 and from the second bus BUS2 to first bus BUS1 becomes impossible. When the signal at the output enable terminal $\overline{OE}$ is at the low level, the signal transmission from the first bus BUS1 to second bus BUS2 or from the second bus BUS2 to the first bus BUS1 is selectively carried out according to the level of the signal at the direction terminal DIR.

Given in Table 2 below are relationships between the levels of signals at the first and second switch terminals SW1 and SW2 and the states of the first to fourth switch circuits SWC1 to SWC4.

TABLE 2

| SW1 | SW2 | SWC1 | SWC2 | SWC3 | SWC4 |
|-----|-----|------|------|------|------|
| H | H | OFF | ON | OFF | ON |
| H | L | OFF | ON | ON | OFF |
| L | H | ON | OFF | OFF | ON |
| L | L | ON | OFF | ON | OFF |

Even when any levels of signals are applied to the switch terminals SW1 and SW2, the switch circuits SWC1 and SC2 or the switch circuits SWC3 and SWC4 will not be put in the ON state at the same time. The state of the first two-way circuit TR1 is determined by combinations shown in Tables 1 and 2 with respect to the direction terminal DIR, output enable terminal OE and the signal levels of the switch terminals SW1 and SW2. Further, by applying signals having different frequencies to the clock terminals CLK1 and CLK2, the operational timing can be made shifted depending on the signal transmission direction. The buffer circuits BUF1 and BUF2 include the output circuit of the embodiment of FIG. 4, the terminals Vin1 and Vin2 in FIG. 12 correspond to the terminal Vin in FIG. 4, the terminals Vout1 and Vout2 in FIG. 12 corresponds to the terminal Vout in FIG. 4, and the terminals $\overline{OE1}$ and $\overline{OE2}$ in FIG. 12 correspond to the terminal $\overline{OE}$ in FIG. 4. Each of the first and second flip-flop circuits F/F1 and F/F2 comprises a D type flip-flop generally well known. In this way, when the output circuit of the present invention is used as a bus buffer circuit, generation of undershoot in signals at the terminals N1 to N16 can be prevented. As a result, when a bus buffer semiconductor integrated circuit using the output circuit of FIG. 12 is used as a constituent element of a system having a plurality of devices connected by means of wiring lines or the like, the need for troublesomely providing external resistors to the terminals of the bus buffer semi-conductor integrated circuit can be eliminated.

Figure 13:
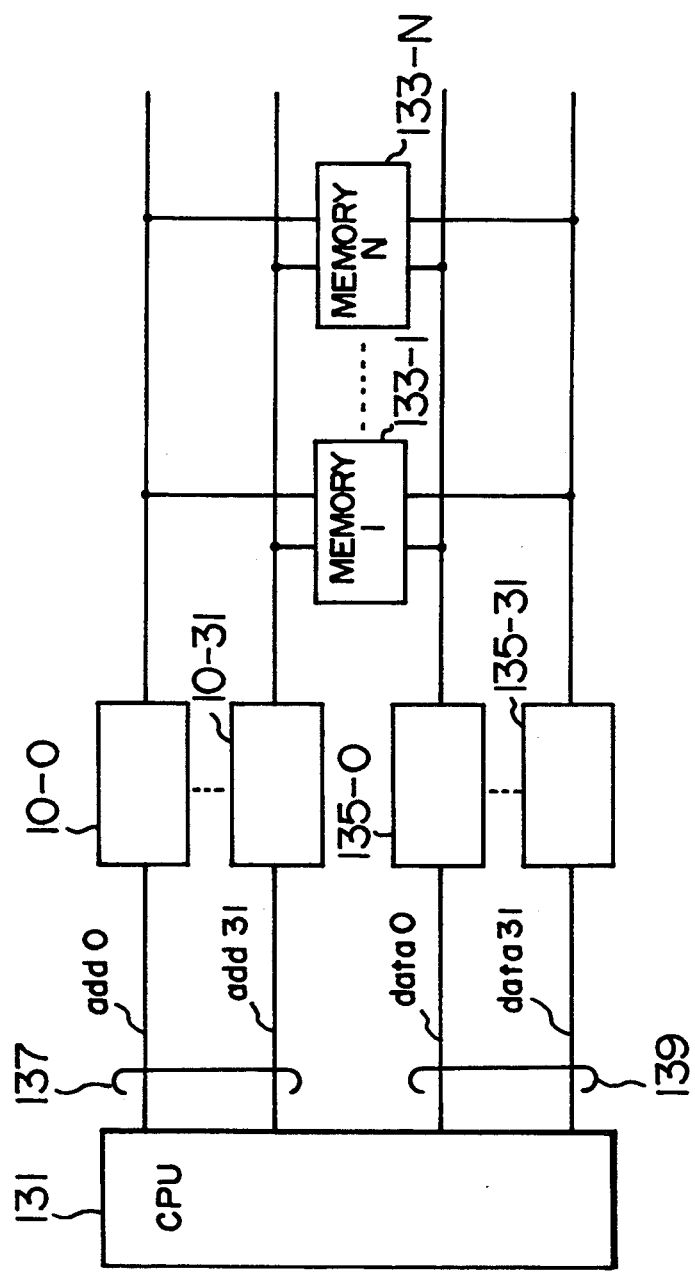
FIG. 13 is a block diagram of a circuit system module including a plurality of chips, to which the present invention is applied.

FIG. 13 is a block diagram of an example in which the present invention is applied as a system module. The system module of FIG. 13 includes a plurality of memory chips formed on the same circuit board. In the drawing, reference numeral 131 denotes a central processing unit (CPU) chip; 133-1 to 133-N denote memory chips respectively; 10-0 to 10-31 denote 1-bit one-way buffer circuits having such an arrangement as shown by the embodiment in FIG. 4 respectively; and 135-0 to 135-31 denote 1-bit two-way buffer circuits, for example, having a simplified form of FIG. 12 respectively. Connected between the CPU chip 131 and the respective memory chips 133-1 to 133-N are address and data buses 137 and 139. The address bus 137 contains, for example, 32 address lines Add0 to Add31 which are connected with the above one-way buffer circuits 10-0 to 10-31 respectively. The data bus 139 contains, for example, 32 data lines Data0 to Data31 which are connected with the above two-way buffer circuits 135-0 to 135-31, respectively.

Figure 14:
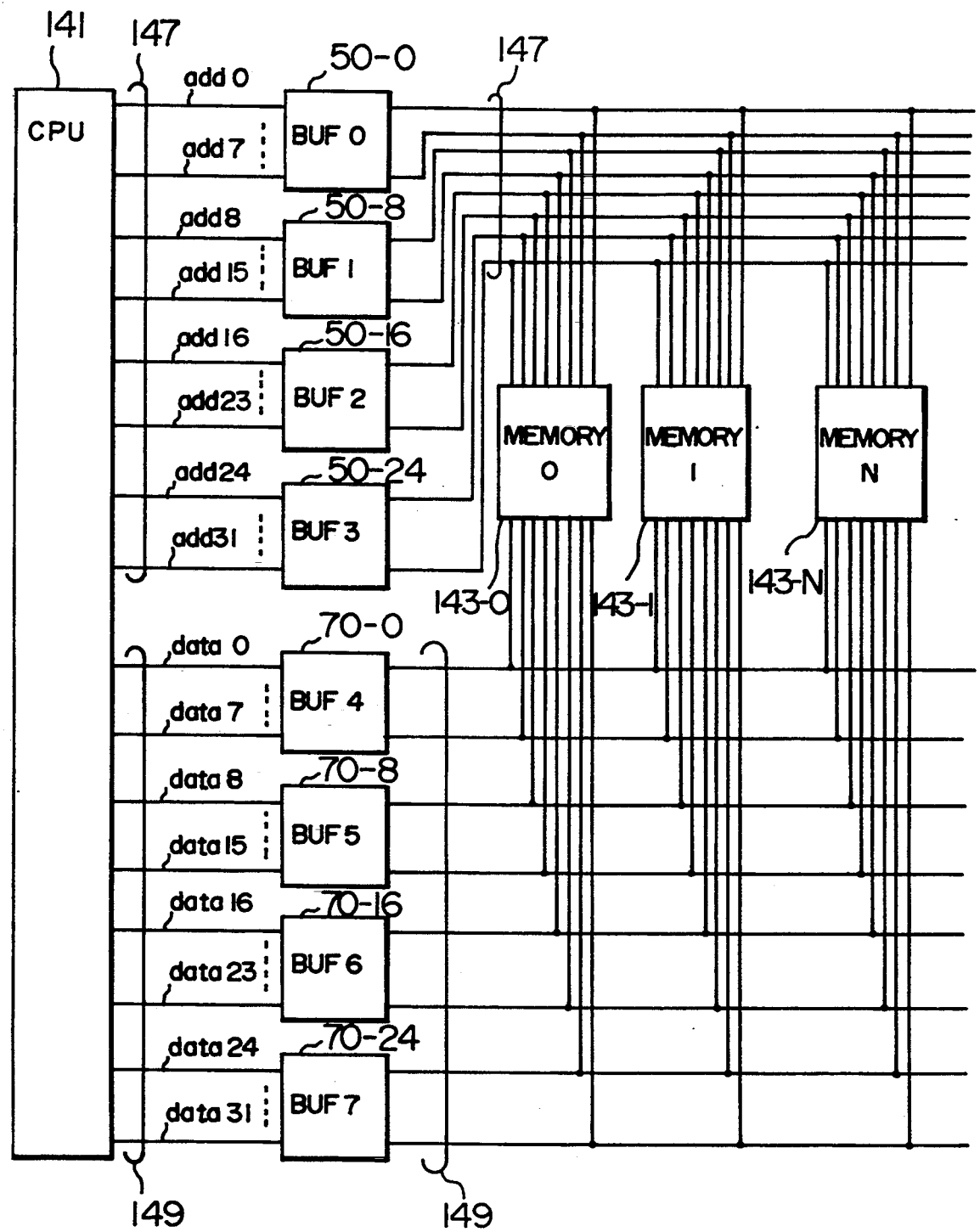
FIG. 14 is a block diagram of another circuit system module including a plurality of chips, to which the present invention is applied.

Referring to FIG. 14, there is shown a block diagram of another example in which the present invention is applied as a system module. In the system module of FIG. 14, reference numeral 141 denotes a CPU chip; 143-0 to 143-N denote respectively independent memory chips; 50-0 to 50-24 denote 8-bit one-way buffer chips 50, for example, shown FIG. 11 respectively; and 70-0 to 70-24 denote 8-bit two-way buffer chips 70, for example, shown in FIG. 12, respectively. The CPU chip 141 and the respective memory chips 143-0 to 143-N are interconnected by means of address and data buses 147 and 149. The address bus 147 contains 32 address lines Add0 to Add31 every 8 of which are connected to the associated 8-bit one-way buffer chips 50-0, 50-8, 50-16 and 50-24. Similarly, the data bus 149 contains 32 data lines Data0 to Data31 every 8 of which are connected to the associated 8-bit two-way buffer chips 70-0, 70-8, 70-16 and 70-24.

Figure 15:
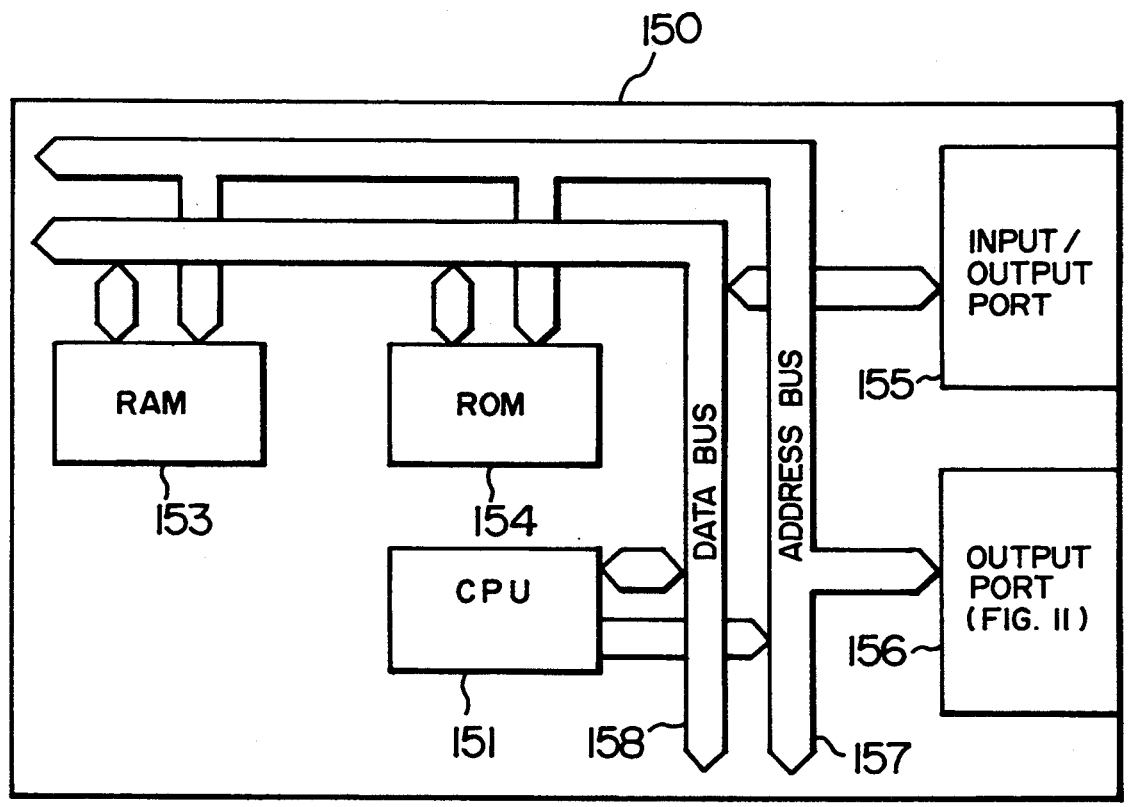
FIG. 15 is a block diagram of a one-chip microcomputer to which the present invention is applied.

FIG. 15 shows an example in which the present invention is applied to a one-chip microcomputer having a CPU, a RAM and a ROM formed on one chip. In the arrangement of the microcomputer of FIG. 15, reference numeral 150 denotes a single semi-conductor substrate, numeral 151 denotes a CPU, 153 denotes a RAM, and 154 denotes a ROM. Further, reference numeral 155 represents an input/output port containing the two-way buffer circuit 70 having the circuit configuration of the embodiment of FIG. 12 according to the present invention, and numeral 156 represents an output port containing such a one-way buffer circuit as to have the circuit arrangement 50 of the embodiment of FIG. 11. The output port 156 is connected through an address bus 157 to the CPU 151, RAM 153 and ROM 154; while the input/output port 155 is connected through a data bus 158 to the CPU 151, RAM 153 and ROM 154.

Although the present invention invented by the inventor of the present application has been detailed in connection with the foregoing embodiments, it should be appreciated that the present invention is not restricted to the specific embodiments and examples and may be modified in various ways without departing from the gist or subject matter of the attached claims.

Thus, in the bus buffer semi-conductor integrated circuit 70 of FIG. 12, the explanation has been made in connection with the case where the 8-bit signals to be transmitted at a given time are all transmitted in the same direction, but the present invention is not limited to the specific example. For example, some of the signals to be transmitted may be transmitted in one direction and the other signals may be transmitted in the other direction. Alternatively, some of the 8-bit signals to be transmitted may be held and transmitted, while the other signals may not be held but transmitted. Furthermore, the 8-bit signals may be previously put in their transmission enable state so that desired ones of the 8-bit signal can be selected and transmitted. Or, the present invention is not restricted only to the 8-bit signals to be transmitted but 4-bit, 16-bit or arbitrary-number-bit signals may be transmitted.

What is claimed is:

1. An output circuit comprising:
   an input terminal receiving an input signal;
   an output terminal;
   a first power supply terminal;
   a second power supply terminal;
   a first p-channel MOSFET having a gate coupled to said input terminal, a source coupled to said second power supply terminal and a drain coupled to said output terminal;
   a first n-channel MOSFET having a gate coupled to said input terminal, a source coupled to said first power supply terminal and a drain coupled to said output terminal; and
   a current injection circuit comprising a reference voltage generation circuit generating a reference voltage and a second n-channel MOSFET having a drain coupled to said second power supply terminal, a source coupled to said output terminal and a gate coupled to receive said reference voltage, said second n-channel MOSFET being in a conductive state when said first n-channel MOSFET is in a conductive state and when a voltage level of said output terminal drops to a predetermined first level, said reference voltage generation circuit discontinuing outputting said reference voltage in response to a voltage level of said output terminal dropping a predetermined second level.

2. An output circuit according to claim 1, wherein said reference voltage generation circuit includes:

a logic circuit having a first input and a second input coupled to said input terminal and an output coupled to said reference voltage generation circuit; and a delay circuit having an input coupled to said output terminal and an output coupled to said first input of said logic circuit, said logic circuit outputting a control signal having a predetermined voltage level when a level of said input signal is a high level and a level of said output of said delay circuit is a high level, wherein said reference voltage generation circuit outputs said reference voltage while said reference voltage generation circuit receives said control signal having said predetermined voltage level.

3. An output circuit according to claim 2, wherein said first power supply terminal receives a ground potential;

wherein said second power supply terminal receives a power supply voltage;

wherein said predetermined level of said control signal is said ground potential, and wherein said logic circuit is an NAND logic circuit.

4. An output circuit according to claim 3, wherein said reference voltage generation circuit comprises:

a second p-channel MOSFET having a gate coupled to receive said control signal, a source coupled to said second power supply terminal and a drain coupled to said gate of said second n-channel MOSFET; and a load circuit coupled between said drain of said second p-channel MOSFET and said first power supply terminal.

5. An output circuit according to claim 4, wherein said load circuit comprises:

a third n-channel MOSFET having a gate coupled to said drain of said second p-channel MOSFET, a drain coupled to said drain of said second p-channel MOSFET and a source; and a fourth n-channel MOSFET having a gate coupled to said source of said third n-channel MOSFET, a drain coupled to said source of said third n-channel MOSFET and a source coupled to said first power supply terminal.

6. An output circuit according to claim 1, wherein said first power supply terminal receives a ground potential, wherein said second power supply terminal receives a power supply voltage, and wherein each of said reference voltage, said predetermined first level and said predetermined second level is between said ground potential and said power supply voltage.

* * * * *